(12) United States Patent
Yano et al.

(10) Patent No.: US 8,030,375 B2
(45) Date of Patent: Oct. 4, 2011

(54) FIBER-REINFORCED COMPOSITE MATERIAL AND PROCESS FOR PRODUCING THE SAME

(75) Inventors: Hiroyuki Yano, Kyoto (JP); Masaya Nogi, Kyoto (JP); Fumiaki Nakatsubo, Kyoto (JP); Shinsuke Ifuku, Kyoto (JP)

(73) Assignees: Nippon Telegraph and Telephone Corporation, Tokyo (JP); Pioneer Corporation, Tokyo (JP); Mitsubishi Chemical Corporation, Tokyo (JP); Rohm Co., Ltd., Kyoto-shi (JP)

( * ) Notice: Subject to any disclaimer, the term of this patent is extended or adjusted under 35 U.S.C. 154(b) by 759 days.

(21) Appl. No.: 11/815,263

(22) PCT Filed: Jan. 31, 2006

(86) PCT No.: PCT/JP2006/301522
§ 371 (c)(1),
(2), (4) Date: Aug. 1, 2007

(87) PCT Pub. No.: WO2006/082803
PCT Pub. Date: Aug. 10, 2006

(65) Prior Publication Data
US 2009/0054552 A1 Feb. 26, 2009

(30) Foreign Application Priority Data

Feb. 1, 2005 (JP) ................. 2005-025382
Jul. 19, 2005 (JP) ................. 2005-208150

(51) Int. Cl.
*B32B 27/38* (2006.01)
*B32B 27/12* (2006.01)

(52) U.S. Cl. ..... 523/200; 428/339; 428/332; 428/292.1; 451/41

(58) Field of Classification Search .................. 523/200; 451/451; 428/339, 332, 292.1
See application file for complete search history.

(56) References Cited

U.S. PATENT DOCUMENTS

| | | | |
|---|---|---|---|
| 4,198,968 A * | 4/1980 | Kalberer et al. | 602/46 |
| 5,143,791 A * | 9/1992 | Flodin et al. | 428/481 |
| 5,981,067 A | 11/1999 | Seethamraju et al. | |
| 6,117,545 A | 9/2000 | Cavaille et al. | |
| 2005/0067730 A1 | 3/2005 | Yano et al. | |
| 2006/0182941 A1* | 8/2006 | Yano et al. | 428/292.1 |

FOREIGN PATENT DOCUMENTS

| | | |
|---|---|---|
| CN | 1200128 A | 11/1998 |
| JP | 61-502968 | 12/1986 |
| JP | 62-36467 | 2/1987 |
| JP | 7-156279 | 6/1995 |
| JP | 8-49188 | 2/1996 |
| JP | 9-207234 | 8/1997 |
| JP | 11-513425 | 11/1999 |
| JP | 2005-60680 | 3/2005 |
| WO | WO 90/03411 | 4/1990 |
| WO | WO 93/10172 | 5/1993 |

OTHER PUBLICATIONS

Hiroyuki Yano, et al., "Organic EL display prepared from Nata de coco", Foundation Bioindustry Society, vol. 63, No. 11, Nov. 1, 2005, pp. 720-721.
S. Iwamato, et al. "Optically transparent composites reinforced with plant fiber-based nanofibers" Applied Physics A Materials Science & Processing. Jul. 7, 2005, pp. 1-4.
Masaya Nogi, et al. "Optically transparent bionanofiber composites with low sensitivity to refractive index of the polymer matrix" American Intitute of Physics, Applied Physics Letters 87, 1, 2005, pp. 1-3.
Masaya Nogi, et al. "Property enhancement of optically transparent bionanofiber composites by acetylation" American Institute of Physics, Applied Physics Letters 89, 233123 (2006), pp. 1-3.
Hiroyuki Yano, et al. "Composite Material Using Bionanofiber Various Uses Available by Making Full Use of High Strength, Low Linear Thermal Expansion and Transparencey" Vegetable-Origin Plastics Expectation and Problems as Ace of Environmental Preservation Materials, pp. 40-43 & 1-6 (with English Translation), (2006).
Kazuo Kitagawa Development of High-Vegetality Composite Material Using Bamboo Fibers (Micro and Nanofibers) Vegetable-Origin Plastics Expectation and Problems as Ace of Environmental Preservation materials, pp. 66-69 and 1-6 (with English Translation), (2006).
Supplementary European Search Report dated Jun. 7, 2011, in EP 06712665 filed on Jan. 31, 2006.

\* cited by examiner

*Primary Examiner* — Robert D. Harlan
(74) *Attorney, Agent, or Firm* — Oblon, Spivak, McClelland, Maier & Neustadt, L.L.P.

(57) ABSTRACT

Disclosed is a highly transparent fiber-reinforced composite material including an assembly of cellulose fibers of 4 to 200 nm average fiber diameter impregnated with a matrix material so as to not only remedy the moisture absorbency attributed to cellulose fibers but also further improve transparency. There is provided a fiber-reinforced composite material including an assembly of cellulose fibers impregnated with a matrix material. In the fiber-reinforced composite material, hydroxyl groups of cellulose fibers are chemically modified through a reaction with one or more chemical modifiers selected from the group consisting of an acid, an alcohol, a halogenating reagent, an acid anhydride, and an isocyanate so that the ratio of a functional group introduced by the chemical modification is 5 to 40 percent by mole based on the hydroxyl groups of cellulose fibers before the chemical modification. The chemical modification of hydroxyl groups of cellulose fibers can reduce the hydrophilicity of cellulose fibers to thereby reduce the moisture absorbency of fiber-reinforced composite material. Further, the affinity between cellulose fibers and matrix material can be enhanced to thereby further improve transparency.

20 Claims, 5 Drawing Sheets

FIBER-REINFORCED COMPOSITE MATERIAL AND PROCESS FOR PRODUCING THE SAME

FIELD OF THE INVENTION

The present invention relates to a fiber-reinforced composite material including an assembly of cellulose fibers impregnated with a matrix material; and a method for manufacturing the same.

BACKGROUND OF THE INVENTION

As fiber-reinforced composite materials, a glass fiber-reinforced resin has been known which is composed of a resin and glass fibers impregnated therewith. This glass fiber-reinforced resin is generally opaque. A method for obtaining a transparent glass fiber-reinforced resin has been disclosed in Patent Documents 1 and 2 mentioned below, in which the refractive index of glass fibers is allowed to coincide with the refractive index of a matrix resin.

The presence of some bacteria that produce cellulose fibers has been known. In Patent Documents 3 and 4, there have been disclosed molded materials having various shapes, such as a sheet, a yarn, and a three-dimensional body, which are formed from cellulose fibers produced by bacteria (hereinafter referred to as "bacterial cellulose").

The known glass fiber-reinforced resins disclosed in Patent Documents 1 and 2 may become opaque under some working conditions. Since the refractive index of a material has a temperature dependence, even when being transparent under certain temperature conditions, the glass fiber-reinforced resins disclosed in Patent Documents 1 and 2 are changed to translucent or opaque under conditions different from the above temperature conditions. The refractive index of each material has its own wavelength dependence; hence, even when the refractive index of fibers and that of a matrix resin are allowed to coincide with each other at a specific visible light wavelength, a region in which the refractive index is shifted may probably exist in the entire visible light region, and as a result, the transparency cannot be obtained in the region described above.

Bacterial cellulose disclosed in Patent Documents 3 and 4 is composed of monofilaments having a fiber diameter of 4 nm, and this fiber diameter is considerably smaller than a visible light wavelength, so that refraction of visible light is unlikely to occur. However, when being used to form a composite together with a resin, the bacterial cellulose is disaggregated for the use in Patent Documents 3 and 4. When a product produced by bacteria is disaggregated by applying a mechanical shearing force typically with a grinder, bacterial cellulose fibers are closely attached to each other during a disaggregation process to form bundles having a large fiber diameter which may cause refraction and scattering of visible light, resulting in degradation in transparency of a composite material formed using the disaggregated cellulose as described above.

As described above, there has not yet been provided a fiber-reinforced composite material that always maintains superior transparency regardless of temperature conditions and wavelength bands.

Patent Document 1: Japanese Unexamined Patent Application Publication No. 9-207234
Patent Document 2: Japanese Unexamined Patent Application Publication No. 7-156279
Patent Document 3: Japanese Unexamined Patent Application Publication No. 62-36467
Patent Document 4: Japanese Unexamined Patent Application Publication No. 8-49188

SUMMARY OF THE INVENTION

An object of the present invention is to provide a fiber-reinforced composite material which includes an assembly of cellulose fibers impregnated with a matrix material and has moisture absorptivity and transparency.

A first aspect of the present invention relates to a fiber-reinforced composite material which includes a matrix material and an assembly of cellulose fibers impregnated with the matrix material. Hydroxy groups of the cellulose fibers are chemically modified through a reaction with one or more chemical modifiers selected from the group consisting of an acid, an alcohol, a halogenating reagent, an acid anhydride, and an isocyanate. The ratio of a functional group introduced by the chemical modification is 5 to 40 percent by mole based on the hydroxy groups of cellulose fibers before the chemical modification.

A second aspect of the present invention relates to a fiber-reinforced composite material which includes a matrix material and an assembly of cellulose fibers impregnated with the matrix material. This material has a moisture regain (rate of moisture absorption) of 3% or less, in which the moisture regain is measured according to the following method of measuring moisture regain:
[Method of Measuring Moisture Regain]
i) A sample is left stand at 50° C. in a dry atmosphere for 24 hours, followed by weighing (dry weight $W_0$).
ii) Next, the sample is left stand in an atmosphere at a temperature of 20° C. and humidity of 60% until the weight becomes constant, followed by weighing (humid weight $W_1$).
iii) The moisture regain is determined by calculation based on the dry weight $W_0$ and the humid weight $W_1$ according to the following equation:

$$\text{Moisture regain (\%)} = (W_1 - W_0)/W_0 \times 100$$

A method for manufacturing a fiber-reinforced composite material according to a third aspect of the present invention includes the steps of bringing an assembly of cellulose fibers into contact with a reaction liquid containing the chemical modifier to cause chemical modification as a result of a reaction between hydroxyl groups of the cellulose fibers and the chemical modifier to thereby yield an assembly of modified cellulose fibers, impregnating the assembly of modified cellulose fibers with an impregnating liquid capable of forming the matrix material, and curing the impregnating liquid.

DETAILED DESCRIPTION OF PREFERRED EMBODIMENTS OF THE INVENTION

Figure 1:
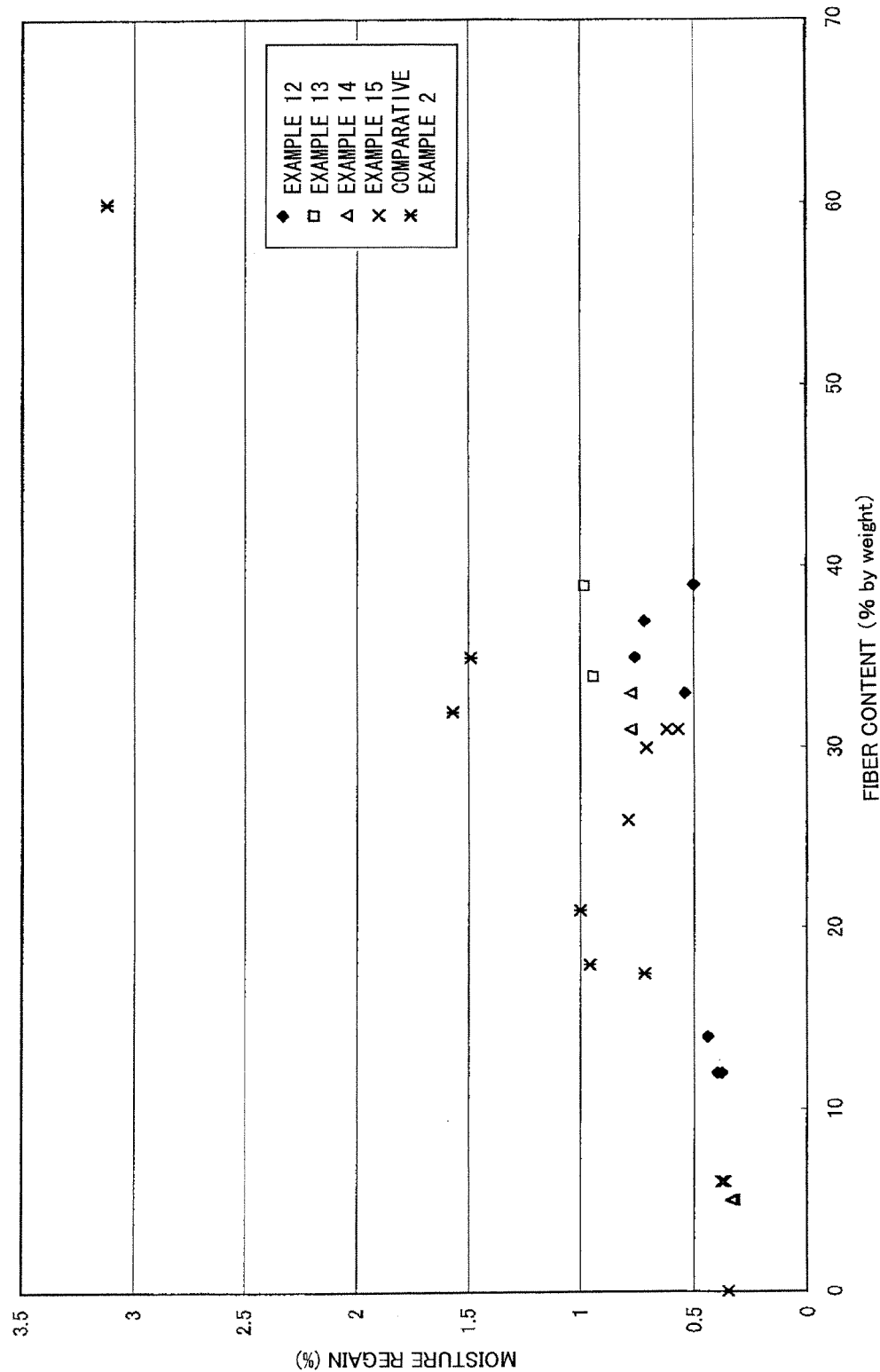
FIG. 1 is a graph showing how the moisture regain of a fiber-reinforced composite material varies depending on the fiber content thereof.

The chemical modification of hydroxyl groups of cellulose fibers reduces the hydrophilic nature of the cellulose fibers to thereby reduce the moisture absorbency of a fiber-reinforced composite material. The chemical modification also increases the affinity between the cellulose fibers and a matrix material to thereby further improve the transparency (optical transparency) of the fiber-reinforced composite material.

Specifically, cellulose is a natural polymer having such a unique structure as to have three hydroxy groups per anhydrous glucose unit. The hydroxy groups firmly adsorb water through hydrogen bonds in a non-crystalline region in surface or inside of cellulose fibers. Cellulose fibers therefore have high moisture absorbency, and a fiber-reinforced composite material containing cellulose fibers exhibits moisture absorption. According to the present invention, hydroxy groups of the cellulose fibers are chemically modified with a proper functional group to thereby suppress chemical adsorption of water by the cellulose fibers. Thus, the moisture absorbency of the fiber-reinforced composite material is remedied.

The chemical modification of the cellulose fibers through introduction of a functional group also increases the affinity between the cellulose fibers and a matrix material to thereby improve adhesion between them. Consequently, the cellulose fibers are sufficiently impregnated with the matrix material to thereby prevent gaps (vacancies) between the cellulose fibers and the matrix material, and this increases the transparency of the fiber-reinforced composite material.

In particular, when the matrix material of the fiber-reinforced composite material has a functional group similar to the functional group introduced into hydroxy groups of the cellulose fibers through chemical modification, the cellulose fibers and the matrix material are bonded with each other through copolymerization at the interface therebetween. This prevents the entry of water and contributes to better transparency.

When an assembly of cellulose fibers is simply impregnated with a reaction liquid containing at least one chemical modifier selected from the group consisting of an acid, an alcohol, a halogenating reagent, an acid anhydride, and an isocyanate upon chemical modification of hydroxy groups of the assembly of cellulose fibers, it is difficult for the reaction liquid to penetrate into spaces between the cellulose fibers constituting the assembly sufficiently and to obtain a practically high reaction rate. This is because the assembly of cellulose fibers has a three-dimensional intersection structure of cellulose fibers, and it is not easy to allow the reaction liquid to penetrate deep into the structure and to come in contact with the cellulose fibers.

A reaction liquid can be smoothly penetrate into an assembly of cellulose fibers, and the chemical modification of cellulose fibers can be carried out with a high reaction efficiency according to the present invention, by replacing water in an assembly of hydrated cellulose with a first organic solvent, and immersing the assembly of cellulose fibers containing the first organic solvent in the reaction liquid. In addition, the assembly of cellulose fibers can be smoothly impregnated with an impregnating liquid by replacing the reaction liquid in the assembly of cellulose fibers after chemical modification with a second organic solvent, and then replacing the second organic solvent with the impregnating liquid.

Preferred embodiments of a fiber-reinforced composite material and a method for manufacturing the material according to the present invention will be illustrated in detail below.

[Assembly of Cellulose Fibers]

Fibers constituting an assembly of cellulose fibers preferable for use in the present invention will be illustrated below.

The average fiber diameter of cellulose fibers is preferably 4 to 200 nm. The fibers may be composed of monofilaments which are not drawn and aligned but are present separately from each other so that spaces therebetween are sufficiently impregnated with the matrix material. In this case, the average fiber diameter is the average diameter of monofilaments. The fibers for use in the present invention may be a single yarn-shaped bundle composed of a plurality of (or a great number of) monofilaments, and in this case, the average fiber diameter is defined as the average diameter of the yarn-shaped bundles. The bacterial cellulose is formed of the latter, that is, the yarn-shaped bundles.

When the average diameter of the cellulose fibers is more than 200 nm, it is closer to the wavelengths of visible light, and as a result, visible light is liable to be refracted at the interfaces with the matrix material. Accordingly, the upper limit of the average diameter of cellulose fibers for use in the present invention is set to 200 nm. Cellulose fibers having an average diameter of less than 4 nm are difficult to produce. The diameter of monofilaments of bacterial cellulose to be described later which is suitably used as the fibers is about 4 nm. The lower limit of the average diameter of cellulose fibers for use in the present invention is therefore set to 4 nm. The average diameter of the cellulose fibers for use in the present invention is preferably in the range of 4 to 100 nm and more preferably in the range of 4 to 60 nm.

The cellulose fibers for use in the present invention may include fibers having diameters out of the range of 4 to 200 nm, as long as the average fiber diameter falls within the range of 4 to 200 nm; however, the ratio thereof is preferably set to 30 percent by weight or less. The fiber diameters of all the fibers are preferably 200 nm or less, more preferably 100 nm or less, and even more preferably 60 nm or less.

The length of the cellulose fibers is not particularly limited; however, the average length is preferably 100 nm or more. If the average length of the cellulose fibers is less than 100 nm, the reinforcing effect may not be significant, and the strength of the fiber-reinforced composite material may be insufficient in some cases. Cellulose fibers having a length of less than 100 nm may be contained in the fibers; however, the ratio thereof is preferably set to 30 percent by weight or less.

Cellulose fibers act to further decrease the coefficient of linear thermal expansion of a fiber-reinforced composite material to be obtained, as described later.

The cellulose fibers are microfibrils of cellulose, which typically form base skeletons of plant cell walls, or fibers constituting the microfibrils and are assemblies of monofilaments generally having a diameter of about 4 nm. Cellulose fibers having 40% or more of a crystal structure are preferably used in order to yield a high strength and a low thermal expansion.

The cellulose fibers may be isolated from plants (vegetables); however, bacterial cellulose produced from bacterial cellulose is suitably used. Bacterial cellulose is prepared by subjecting a product produced from bacteria to alkaline treatment so as to remove bacteria by dissolution. The resulting bacterial cellulose which is not disaggregated is preferably used.

A method for producing bacterial cellulose will be illustrated below.

Examples of living organisms on the earth that are able to produce cellulose, in addition to living organisms in Plantae, include sea squirts in Animalia; various algae, oomycetes, and myxomycetes in Protista; and blue-green algae, some acetic acid bacteria, and some soil bacteria in Monera. As of today, living organisms that are able to produce cellulose have not been found in Mycota (true fungi). Of the acetic acid bacteria, the genus *Acetobacter* may be mentioned, and more particularly, for example, *Acetobacter aceti, Acetobacter* subsp., and *Acetobacter xylinum* may be mentioned; however, the acetic acid bacteria are not limited thereto. Two or more living organisms that are able to produce cellulose may be used.

By culturing the bacterium as described above, cellulose is produced therefrom. Since the product thus obtained contains bacterium and cellulose fibers (bacterial cellulose) connected to the bacterium from which the fibers are produced, this product is recovered from a culture medium, followed by removal of the bacterium by washing with water or alkaline treatment, so that hydrated bacterial cellulose containing no bacterium can be obtained.

Examples of a culture medium include an agar solid culture medium and a liquid culture medium (culture fluid). The culture fluid includes, for example, a culture fluid having a pH of 3.0 adjusted with acetic acid and containing 7 percent by weight of coconut milk (0.7 percent by weight of total nitrogen component and 28 percent by weight of lipid) and 8 percent by weight of sucrose, and an aqueous solution (SH culture medium) having a pH of 5.0 adjusted with hydrochloric acid and containing 2 percent by weight of glucose, 0.5 percent by weight of bactoyeast extract, 0.5 percent by weight of bactopeptone, 0.27 percent by weight of disodium hydrogen phosphate, 0.115 percent by weight of citric acid, and 0.1 percent by weight of magnesium sulfate heptahydrate.

As a culture method, for example, the following may be mentioned. After an acetic acid bacterium such as *Acetobacter xylinum* FF-88 is inoculated into a coconut milk culture fluid, for example, in the case of FF-88, stationary culture is performed at 30° C. for 5 days, so that a primary culture fluid is obtained. After a gel component is removed from the primary culture fluid thus obtained, a liquid component is added to a culture fluid similar to that described above at a ratio of 5 percent by weight, followed by stationary culture at 30° C. for 10 days, thereby obtaining a secondary culture fluid. This secondary culture fluid contains about 1 percent by weight of cellulose fibers.

As another culture method, a method using an aqueous solution (SH culture fluid) having a pH of 5.0 adjusted with hydrochloric acid as a culture fluid may be mentioned. This aqueous solution contains 2 percent by weight of glucose, 0.5 percent by weight of bactoyeast extract, 0.5 percent by weight of bactopeptone, 0.27 percent by weight of disodium hydrogen phosphate, 0.115 percent by weight of citric acid, and 0.1 percent by weight of magnesium sulfate heptahydrate. In the case described above, the SH culture fluid is added to a strain of acetic acid bacteria stored in a freeze-dried state, followed by stationary culture at 25° C. to 30° C. for 1 week. On the surface of the culture fluid, bacterial cellulose is produced, and after a relatively thick part of the bacterial cellulose thus produced is selected, a small amount of the culture fluid thereof is sampled and is then added to a new culture fluid. Subsequently, this culture fluid is placed in a large incubator, followed by stationary culture at 25° C. to 30° C. for 7 to 30 days. As described above, bacterial cellulose can be obtained by repeatedly performing a process: "a part of an existing culture fluid is added to a new culture fluid, followed by stationary culture for about 7 to 30 days".

When a problem such as unsatisfactory production of cellulose by bacterium arises, the following procedure is carried out. A small amount of a culture fluid in which the bacterium is being cultured is sprayed onto an agar culture medium formed by adding an agar to a culture fluid and is then allowed to stand for about 1 week, so that colonies are formed. After the individual colonies thus formed are observed, a colony which may effectively produce cellulose is recovered from the agar culture medium and is then added to a new culture fluid to perform culture.

Bacterial cellulose thus produced is recovered from the culture fluid, and remaining bacteria in the bacterial cellulose are removed. As a removing method, for example, water washing or alkaline treatment may be mentioned. As alkaline treatment for removing bacteria by dissolution, for example, a method may be mentioned in which bacterial cellulose recovered from a culture fluid is immersed in an aqueous alkaline solution at an alkaline concentration of about 0.01 to 10 percent by weight for 1 hour or more. When alkaline treatment is performed, bacterial cellulose is recovered from an alkaline treatment solution, and water washing is then sufficiently performed so as to remove the alkaline treatment solution.

The hydrated bacterial cellulose thus obtained generally contains 95 to 99.9 percent of water and 0.1 to 5 percent by volume of fibers. It is an assembly of fibers that is impregnated with water and has a three-dimensional intersection structure of monofilaments having an average fiber diameter of about 50 nm. Such bacterial cellulose forming a three-dimensional intersection structure is hereinafter also referred to as "three-dimensional intersection bacterial cellulose structure."

This "three-dimensional intersection bacterial cellulose structure" means "a substance which can be handled as one structural body although having a bulky state (having a sparse state) since bacterial cellulose has a three-dimensional intersection structure" and is produced by culturing bacteria capable of producing cellulose fibers in a culture medium as described above.

The above structure is a structure in which bacteria randomly move around while producing (discharging) cellulose fibers, and the cellulose fibers thereby complicatedly (three-dimensionally) intersect each other. This complicated intersection becomes further complicated as branches of cellulose are produced due to cell division in bacteria.

When being cultured using an appropriate shape such as a film, plate, block, or predetermined shape (such as lens), the three-dimensional intersection bacterial cellulose structure may be formed in conformity with the shape mentioned above. Hence, in accordance with purposes, a three-dimensional intersection bacterial cellulose structure having an optional shape can be obtained.

The three-dimensional intersection bacterial cellulose structure is processed by alkaline treatment and/or washing treatment with water for removing bacteria upon production of hydrated bacterial cellulose as described above. By these treatments, the three-dimensional intersection of the three-dimensional intersection bacterial cellulose is not degraded. In addition, even when water contained in the hydrated bacterial cellulose is replaced with a mediating liquid and when the bacterial cellulose is subjected to a pressing process before or after the replacement, this three-dimensional intersection state can be retained.

Bacterial cellulose described above is preferably used as the fibers for use in the present invention; however, cellulose fibers may also be used which is obtained, for example, from sea weeds, cysts of sea squirts, or plant cell walls by treatment such as treatment of beating and/or pulverizing, high temperature/high pressure water vapor treatment, or treatment using a phosphate.

In the case described above, the treatment of beating and/or pulverizing are performed by directly applying a force to plant cell walls, sea weeds, or cysts of sea squirts, from which lignin and other similar substances are removed beforehand, so that fibers are separated from each other, thereby obtaining cellulose fibers.

More specifically, as shown in examples which will be described later, an aqueous suspension is formed containing about 0.1 to 3 percent by weight of microfibrillated cellulose fibers (hereinafter referred to as "MFC") having an average fiber diameter of about 0.1 to 10 μm, which are obtained by microfibrillation typically of pulps using a high pressure homogenizer, and grinding or ultra grinding treatment is further repeatedly performed typically with a grinder, so that nanometer-ordered MFC (hereinafter simply referred to as "Nano MFC") having an average diameter of about 10 to 100 nm can be obtained. After an aqueous suspension containing about 0.01 to 1 percent by weight of this Nano MFC is formed and is then filtrated, a sheet thereof is obtained.

The grinding or ultra grinding treatment described above can be performed, for example, by using, for example, a grinder supplied under the trade name of "Pure Fine Mill" from Kurita Machinery Mfg. Co., Ltd.

This grinder is a stone mill type pulverizer in which a raw material is pulverized into ultrafine particles by impact, centrifugal force, and shearing force, which are generated when the raw material passes through a space formed between two grinders disposed in a vertical direction, and by this pulverizer, shearing, grinding, particularization, dispersion, emulsification, and fibrillation can be simultaneously performed. The grinding or ultra grinding treatment can also be performed by an ultrafine particle grinder supplied under the trade name "Super Masscolloider" from Masuko Sangyo Co., Ltd. Super Masscolloider is a grinding machine performing ultrafine particularization which can go beyond the concept of pulverization and can obtain a state in which ground particles are as if being melted. Super Masscolloider is a stone mill type ultrafine particle grinder in which two non-porous grinding stones are disposed in a vertical direction with a freely adjustable space provided therebetween, the upper side grinding stone is fixed, and the lower side grinding stone rotates at a high speed. A raw material charged into a hopper is supplied by a centrifugal force to the space between the two grinding stones and is then gradually ground by significantly high compression, shearing, and rolling friction forces generated therebetween, thereby performing ultrafine particularization.

The high temperature/high pressure water vapor treatment is a treatment method for obtaining cellulose fibers by exposing sea weeds, cysts of sea squirts, or plant cell walls, from which lignin and other similar substances are removed beforehand, to high temperature/high pressure water vapor so that the fibers are separated from each other.

The treatment typically using a phosphate is a treatment method for obtaining cellulose fibers. This method includes the steps of performing phosphate esterification of surfaces typically of sea weeds, cysts of sea squirts, or plant cell walls so as to decrease bonding forces between cellulose fibers, then performing refiner treatment so that fibers are separated from each other. Plant cell walls, sea weeds, or cysts of sea squirts, from which lignin and similar substances are removed beforehand, are immersed in a solution containing 50 percent by weight of urea and 32 percent by weight of phosphoric acid so as to be sufficiently impregnated therewith at 60° C., and phosphorylation is promoted at 180° C. by heating. After washing with water, hydrolysis treatment is performed in an aqueous hydrochloric acid solution at a concentration of 3 percent by weight at 60° C. for 2 hours, and again washing is performed with water. Subsequently, treatment is performed in an aqueous sodium carbonate solution at a concentration of 3 percent by weight at room temperature for about 20 minutes so as to complete the phosphorylation. Next, the material thus treated is defiberized by a refiner, thereby obtaining cellulose fibers.

Two or more of different cellulose fibers derived typically from different plants or those obtained by different treatments may be used in combination.

The hydrated Nano MFC thus obtained is an assembly of fibers which have a subnetwork structure of monofilaments having an average fiber diameter of about 100 nm and are impregnated with water. The subnetwork structure is a structure which is not a complete (entire) network structure as with the bacterial cellulose but locally forms a network.

The resulting assembly of hydrated cellulose fibers such as hydrated bacterial cellulose or hydrated Nano MFC is then subjected to dehydration (removal of water).

A dehydration process is not particularly limited and includes, for example, a process in which after being allowed to stand or processed typically by cold pressing for removing a certain amount of water, cellulose is again allowed to stand or is processed typically by hot pressing for removing all the remaining water, and a process in which after cold pressing, water is removed using a drying machine or by spontaneous drying.

The process in which the cellulose is allowed to stand for removing a certain amount of water is a process for gradually removing water by evaporation over a long period of time.

The cold pressing is a process for removing water by applying pressure without heating, to thereby squeeze out a certain amount of water. The pressure used in this cold pressing is preferably 0.01 to 10 MPa and more preferably 0.1 to 3 MPa. When the pressure is less than 0.01 MPa, the amount of remaining water tends to be large, and when the pressure is more than 10 MPa, the resulting assembly of cellulose fibers may be degraded in some cases. The temperature is not particularly limited; however, in consideration of convenient processing, room temperature is preferable.

The process in which the cellulose is allowed to stand for totally removing the remaining water is a process for drying assembly of cellulose fibers for a long period of time.

The hot pressing is a process for removing water by applying pressure with heat, and all the remaining water can be removed. The pressure used in this hot pressing is preferably 0.01 to 10 MPa and more preferably 0.2 to 3 MPa. When the pressure is less than 0.01 MPa, water may not be removed, and when the pressure is more than 10 MPa, the resulting assembly of cellulose fibers may be degraded. The temperature is preferably 100° C. to 300° C. and more preferably 110° C. to 200° C. When the temperature is lower than 100° C., removal of water may take a long time, and when the temperature is higher than 300° C., for example, decomposition of assembly of cellulose fibers may occur.

A drying temperature of the drying machine is preferably 100° C. to 300° C. and more predetermined 110° C. to 200° C.

When the drying temperature is lower than 100° C., water may not be removed in some cases, and when the drying temperature is higher than 300° C., for example, decomposition of cellulose fibers may occur.

Although depending typically on culture conditions, and/or conditions of pressure and temperature in a subsequent water removal step, the assembly of cellulose fibers thus obtained is generally in the form of a sheet having a bulk density of about 1.1 to 3 kg/m$^3$ and a thickness of about 40 to 60 μm.

[Assembly of Modified Cellulose Fibers]

Next, a process of producing an assembly of modified cellulose fibers by chemically modifying hydroxy groups of the assembly of cellulose fibers will be illustrated.

By chemically modifying hydroxy groups of cellulose fibers in the assembly of cellulose fibers with one or more selected from the group consisting of an acid, an alcohol, a halogenating reagent, an acid anhydride, and an isocyanate, a hydrophobic functional group is introduced thereinto through at least one of ether bond, ester bond, and urethane bond.

Examples of the functional group to be introduced into hydroxyl groups of cellulose fibers include acetyl group, methacryloyl group, propanoyl group, butanoyl group, iso-butanoyl group, pentanoyl group, hexanoyl group, heptanoyl group, octanoyl group, nonanoyl group, decanoyl group, undecanoyl group, dodecanoyl group, myristoyl group, palmitoyl group, stearoyl group, pivaloyl group, 2-methacryloyloxyethyl isocyanoyl group, methyl group, ethyl group, propyl group, iso-propyl group, butyl group, iso-butyl group, tert-butyl group, pentyl group, hexyl group, heptyl group, octyl group, nonyl group, decyl group, undecyl group, dodecyl group, myristyl group, palmityl group, and stearyl group.

One or more of these functional groups may be introduced into the hydroxyl groups of cellulose fibers.

Of these, ester functional groups are preferred, of which acetyl group and/or methacryloyl group is especially preferred.

The functional group to be introduced is preferably the same functional group or a functional group of the same type as that of a synthetic polymer used as the matrix material. This results in bonding between the functional group of cellulose fibers and the functional group of the matrix material resin through covalent bond and, in turn, results in effective reduction in moisture absorbency and further improvements in transparency.

When a relatively bulky functional group, such as methacryloyl group, pivaloyl group, long-chain alkyl group, long-chain alkanoyl group, or 2-methacryloyloxyethyl isocyanoyl group, is introduced, it is difficult to chemically modify cellulose fibers at a high degree of chemical modification by using such a bulky functional group alone. Such a bulky functional group is therefore desirably introduced by once introducing the bulky functional group and carrying out another chemical modification to thereby introduce a not-bulky functional group, such as acetyl group, propanoyl group, methyl group, or ethyl group, into residual hydroxy groups. Thus, chemical modification can be conducted with a higher degree of chemical modification.

Examples of one or more chemical modifiers selected from the group consisting of an acid, an alcohol, a halogenating reagent, an acid anhydride, and an isocyanate for the introduction of a functional group will be illustrated below.

TABLE 1

| Functional group to be introduced | Chemical modifier |
|---|---|
| Acetyl group | acetic acid, acetic anhydride, acetyl halides |
| Methacryloyl group | methacrylic acid, methacrylic anhydride, methacryloyl halides |
| Propanoyl group | propanoic acid, propanoic anhydride, propanoyl halides |
| Butanoyl group | butanoic acid, butanoic anhydride, butanoyl halides |
| Iso-butanoyl group | iso-butanoic acid, iso-butanoic anhydride, iso-butanoyl halides |
| Pentanoyl group | pentanoic acid, pentanoic anhydride, pentanoyl halides |
| Hexanoyl group | hexanoic acid, hexanoic anhydride, hexanoyl halides |
| Heptanoyl group | heptanoic acid, heptanoic anhydride, heptanoyl halides |
| Octanoyl group | octanoic acid, octanoic anhydride, octanoyl halides |
| Nonanoyl group | nonanoic acid, nonanoic anhydride, nonanoyl halides |
| Decanoyl group | decanoic acid, decanoic anhydride, decanoyl halides |
| Undecanoyl group | undecanoic acid, undecanoic anhydride, undecanoyl halides |
| Dodecanoyl group | dodecanoic acid, dodecanoic anhydride, dodecanoyl halides |
| Myristoyl group | myristic acid, myristic anhydride, myristoyl halides |
| Palmitoyl group | palmitic acid, palmitic anhydride, palmitoyl halides |
| Stearoyl group | stearic acid, stearic anhydride, stearoyl halides |
| Pivaloyl group | pivalic acid, pivalic anhydride, pivaloyl halides |
| 2-Methacryloyloxyethyl isocyanoyl group | 2-methacryloyloxyethyl isocyanate |
| Methyl group | methyl alcohol, methyl halides |
| Ethyl group | ethyl alcohol, ethyl halides |
| Propyl group | Ɔpropyl alcohol, propyl halides |
| Iso-propyl group | iso-propyl alcohol, iso-propyl halides |
| Butyl group | butyl alcohol, butyl halides |
| Tert-butyl group | tert-butyl alcohol, tert-butyl halides |
| Pentyl group | pentyl alcohol, pentyl halides |
| Hexyl group | hexyl alcohol, hexyl halides |
| Heptyl group | heptyl alcohol, heptyl halides |
| Octyl group | octyl alcohol, octyl halides |
| Nonyl group | nonyl alcohol, nonyl halides |
| Decyl group | decyl alcohol, decyl halides |
| Undecyl group | undecyl alcohol, undecyl halides |
| Dodecyl group | dodecyl alcohol, dodecyl halides |
| Myristyl group | myristyl alcohol, myristyl halides |
| Palmityl group | palmityl alcohol, palmityl halides |
| Stearyl group | stearyl alcohol, stearyl halides |

If the chemical modification of cellulose fibers is conducted at an excessively low degree, the moisture absorbency and transparency as a result of the introduction of a functional group through chemical modification may not be sufficiently effectively improved. In contrast, excessive chemical modification (with disentangling) of hydroxyl groups present deep inside the cellulose fibers is meaningless for the purpose of suppressing moisture absorbency. In addition, this may invite, for example, decrease in mechanical strength. The degree of chemical modification is therefore suitably set to 40 percent by mole or less. Accordingly, the degree of chemical modification may be 5 to 40 percent by mole, and is preferably 10 to 25 percent by mole.

The chemical modification of cellulose fibers can be carried out according to an ordinary procedure such as a process of immersing the assembly of cellulose fibers in a liquid containing a chemical modifier and holding the same under appropriate conditions for a predetermined period of time.

In this case, the reaction liquid containing a chemical modifier may be composed of a chemical modifier and a catalyst alone or may be a solution of a chemical modifier. A solvent for dissolution of a chemical modifier and a catalyst is not particularly limited. Examples of catalysts usable herein include basic catalysts such as pyridine, N,N-dimethylaminopyridine, triethylamine, sodium hydride, tert-butyllithium, lithium diisopropylamide, potassium tert-butoxide, sodium methoxide, sodium ethoxide, sodium hydroxide, and sodium acetate; and acidic catalysts such as acetic acid, sulfuric acid, and perchloric acid. A basic catalyst such as pyridine is preferably used for higher reaction rate and/or for maintaining a sufficient degree of polymerization. Sodium acetate is preferred because the reaction can be carried out at a higher temperature so as to increase the degree of chemical modification, while avoiding coloring of the resulting assembly of cellulose fibers caused by chemical modification. Perchloric acid or sulfuric acid is preferred because the reaction can be carried out under reaction conditions of a small amount of a chemical modifier at room temperature for a short time so as to increase the degree of chemical modification, while avoiding coloring of the resulting assembly of cellulose fibers caused by chemical modification. When a solution of chemical modifier is used as the reaction liquid, the concentration of the chemical modifier in the reaction liquid is preferably 1 to 75 percent by weight. It is more preferably 25 to 75 percent by weight in the presence of a basic catalyst; and is more preferably 1 to 20 percent by weight in the presence of an acidic catalyst.

If a temperature condition in the chemical modification treatment is excessively high, yellowing of cellulose fibers may occur and/or the cellulose fibers may have a decreased degree of polymerization. If it is excessively low, the reaction rate may decrease. The temperature is preferably within a range from about 40° C. to about 100° C. The chemical modification treatment may be carried out by leaving the cellulose fibers stand under a reduced pressure of about 1 kPa for about one hour. Thus, the reaction liquid can penetrate deep into fine spaces inside the assembly of cellulose fibers, and this increases the contact efficiency between the cellulose fibers and the chemical modifier. While being set depending on the reaction liquid used and the reaction rate under the treatment conditions, the reaction time is generally from about 1 day to about 14 days.

[Preferred Method for Producing Assembly of Modified Cellulose Fibers]

An assembly of cellulose fibers prepared by removing water from an assembly of hydrated cellulose fibers typically through cold pressing, hot pressing, or drying with a drying apparatus is poor in permeability or impregnation ability of the reaction liquid containing the chemical modifier and has a low reaction rate in chemical modification, because of the three-dimensional intersection structure of constitutional fibers as described above.

The process for producing the assembly of cellulose fibers preferably includes the steps of: removing, through cold pressing alone according to necessity, only part of water from an assembly of hydrated cellulose fibers such as a hydrated bacterial cellulose or hydrated Nano MFC before dehydration treatment to thereby yield an assembly of hydrated cellulose fibers containing a small amount of water (first step); replacing water in the assembly of hydrated cellulose fibers with a suitable organic solvent (first organic solvent) (second step); and bringing the assembly of cellulose fibers containing the organic solvent into contact with the reaction liquid so as to allow the reaction liquid to penetrate deep into the assembly of hydrated cellulose fibers (third step). Thus, the cellulose fibers can be in contact with the reaction liquid more efficiency, and the chemical modification is carried out at a higher reaction rate.

The first organic solvent for use herein is preferably one that is capable of mixing homogenously with water and a reaction liquid containing the chemical modifier and has a boiling point lower than those of water and the reaction liquid, so as to replace water in the assembly of hydrated cellulose fibers with the first organic solvent smoothly and to replace the first organic solvent with the reaction liquid containing the chemical modifier smoothly. Specifically, preferred organic solvents are water-soluble organic solvents including alcohols such as methanol, ethanol, propanol, and isopropanol; ketones such as acetone; ethers such as tetrahydrofuran and 1,4-dioxane; amides such as N,N-dimethylacetamide and N,N-dimethylformamide; carboxylic acids such as acetic acid; nitrites such as acetonitrile; and aromatic heterocyclic compounds such as pyridine. Among them, organic solvents such as ethanol and acetone are preferred for their easy availability and easy handleability. Each of these organic solvents can be used alone or in combination.

A process for replacing water in the assembly of hydrated cellulose fibers with a first organic solvent is not particularly limited and includes a process of immersing and leaving stand the assembly of hydrated cellulose fibers in the first organic solvent for a predetermined time to allow water in the assembly of hydrated cellulose fibers to leach out into the first organic solvent, and exchanging the first organic solvent containing leached-out water with a fresh first organic solvent as appropriate so as to replace water in the assembly of hydrated cellulose fibers with the first organic solvent. The immersion-replacement treatment is preferably carried out at temperatures of about 0° C. to about 60° C. and is generally carried out at room temperature, so as to prevent volatilization of the first organic solvent.

It is desirable to remove part of water contained in the assembly of cellulose fibers by subjecting the assembly of hydrated cellulose fibers to cold pressing prior to the replacement of water in the assembly of hydrated cellulose fibers with the first organic solvent. Thus, the replacement of water with the first organic solvent can be carried out efficiently.

The degree of pressing is set according to the fiber content of a target fiber-reinforced composite material as a result of this pressing and a pressing before the impregnation of the assembly of modified cellulose fibers with the impregnating liquid as mentioned below. In general, it is preferably set so that the thickness of the assembly of hydrated cellulose fibers becomes about one-half to one-twentieth of the thickness before pressing. A pressure and a holding time in the cold pressing can be set within ranges of 0.01 to 100 MPa and 0.1 to 30 minutes, respectively, as appropriate according to the degree of pressing. In this connection, if carried out at a pressure of 10 MPa or more, the pressing should be conducted, for example, at a lower speed so as to avoid destruction of the assembly of cellulose fibers. The pressing is preferably carried out at temperatures of from about 0° C. to about 60° C. and is generally carried out at room temperature, for the same reason as in the temperature condition in the replacement between water and the organic solvent. The assembly of hydrated cellulose fibers having a smaller thickness as a result of the pressing treatment maintains its thickness even after the replacement between water and the first organic solvent. This pressing, however, is not always necessary, and the assembly of hydrated cellulose fibers without pressing may be immersed in a first organic solvent so as to replace water with the first organic solvent.

After replacing water in the hydrated cellulose fibers with the first organic solvent, the assembly of cellulose fibers containing the organic solvent is immersed in a reaction liquid, followed by chemical modification. This treatment can be carried out under the same conditions as those in the chemical modification treatment of assembly of cellulose fibers after dehydration, except that the treatment time can be shortened to a range of about 1 day to about 7 days by increasing the reaction rate.

[Manufacturing of Fiber-Reinforced Composite Material from Assembly of Modified Cellulose Fibers]

A fiber-reinforced composite material may be manufactured from the assembly of modified cellulose fibers thus prepared by replacing the reaction liquid contained in the assembly of modified cellulose fibers after chemical modification treatment with an impregnating liquid capable of forming a matrix material, and curing the impregnating liquid.

The impregnation of the assembly of modified cellulose fibers with the impregnating liquid may be carried out by subjecting the assembly of modified cellulose fibers after chemical modification treatment which contains the reaction liquid to hot pressing to yield a dried assembly of modified cellulose fibers, and impregnating the dried assembly of modified cellulose fibers with the impregnating liquid.

In another acceptable procedure, the reaction liquid contained in the assembly of modified cellulose fibers after chemical modification treatment is replaced with an organic solvent (second organic solvent) (fourth step). Specifically, the assembly of modified cellulose fibers containing the reaction liquid after chemical modification treatment is immersed in a second organic solvent to wash out the reaction liquid, while exchanging the second organic solvent with a fresh one several times, and the assembly of modified cellulose fibers with the organic solvent is subjected to hot pressing according to necessity to yield a dried assembly of modified cellulose fibers, and the dried assembly of modified cellulose fibers is impregnated with an impregnating liquid.

In yet another acceptable procedure, the assembly of modified cellulose fibers with the second organic solvent is molded by cold pressing, and the molded article is impregnated with an impregnating liquid so as to replace the second organic solvent with the impregnating liquid (fifth step). According to this procedure, the impregnation of the assembly of modified cellulose fibers with the impregnating liquid can be carried out efficiently.

Hereinafter the process of replacing a reaction liquid contained in an assembly of modified cellulose fibers after chemical modification treatment with an organic solvent and then impregnating the assembly with an impregnating liquid is also referred to as "organic solvent replacing process".

The second organic solvent is preferably one that is capable of mixing homogenously with the reaction liquid and the impregnating liquid and has a boiling point lower than those of the reaction liquid and the impregnating liquid, so as to replace the reaction liquid containing a chemical modifier with the second organic solvent smoothly and to further replace the reaction liquid containing the chemical modifier with the impregnating liquid smoothly. Specifically, preferred organic solvents are water-soluble organic solvents including alcohols such as methanol, ethanol, propanol, and isopropanol; ketones such as acetone; ethers such as tetrahydrofuran and 1,4-dioxane; amides such as N,N-dimethylacetamide and N,N-dimethylformamide; carboxylic acids such as acetic acid; nitrites such as acetonitrile; and aromatic heterocyclic compounds such as pyridine. Among them, organic solvents such as ethanol and acetone are preferred for their easy availability and easy handleability. Each of these organic solvents can be used alone or in combination.

A process for replacing the reaction liquid contained in the assembly of modified cellulose fibers is not particularly limited and includes a process of immersing and leaving the assembly of cellulose fibers in the second organic solvent for a predetermined time to allow the reaction liquid in the assembly of cellulose fibers to leach out into the second organic solvent, and exchanging the second organic solvent containing the leached reaction liquid with a fresh second organic solvent as appropriate so as to replace the reaction liquid contained in the assembly of modified cellulose fibers with the second organic solvent. This immersion-replacement treatment can be carried out under the same conditions as in the replacement of water in the assembly of hydrated cellulose fibers with the first organic solvent.

The degree of the cold pressing or the hot pressing prior to the impregnation with the impregnating liquid is set according to the fiber content of a target fiber-reinforced composite material. In general, it is preferably set so that the thickness of a precursor for fiber-reinforced composite material after the pressing becomes about one half to one twentieth of the thickness before pressing. A pressure and a holding time in the cold pressing or hot pressing can be set within ranges of 0.01 to 100 MPa and 0.1 to 30 minutes, respectively, as appropriate according to the degree of pressing. In this connection, if carried out at a pressure of 10 MPa or more, the pressing should be conducted, for example, at a lower speed so as to avoid destruction of the assembly of cellulose fibers. The cold pressing is preferably carried out at temperatures of from about 0° C. to 60° C. and is more preferably carried out at room temperature. The hot pressing is preferably carried out at temperatures of from about 100° C. to about 300° C. and more preferably from about 110° C. to about 200° C. If the temperature is lower than 100° C., it may take a long time to remove water. In contrast, if it is higher than 300° C., the decomposition of assembly of cellulose fibers, for example, may occur.

The pressing treatment is conducted in order to adjust the fiber content of a fiber-reinforced composite material as a final product. The pressing is not always necessary and the assembly of modified cellulose fibers containing the second organic solvent may be subjected, without pressing, to the replacement with an impregnating liquid when the fiber content is sufficiently adjusted through pressing in a precedent step.

The replacement of the second organic solvent contained in the assembly of modified cellulose fibers with the impregnating liquid, and the impregnation of the dried assembly of modified cellulose fibers with the impregnating liquid can be carried out by any process, but they are preferably carried out according to a process of immersing the assembly of modified cellulose fibers containing the second organic solvent or the dried assembly of modified cellulose fibers in the impregnating liquid and holding them under reduced pressure. Thus, the second organic solvent in the assembly of modified cellulose fibers volatilizes and in place the impregnating liquid penetrates into the assembly of modified cellulose fibers so that the second organic solvent in the assembly of modified cellulose fibers is replaced with the impregnating liquid. Alternatively, the impregnating liquid penetrates into the dried assembly of modified cellulose fibers so that the assembly of modified cellulose fibers is impregnated with the impregnating liquid.

The reduced pressure condition herein is not particularly limited, but the pressure is preferably 0.133 kPa (1 mmHg) to 93.3 kPa (700 mmHg). If the reduced pressure is larger than 93.3 kPa (700 mmHg), the removal of the second organic solvent or the impregnation of the impregnating liquid may be insufficient, and the second organic solvent or vacancies may remain between fibers constituting the assembly of modified cellulose fibers. In contrast, the reduced pressure may be set to be lower than 0.133 kPa (1 mmHg), but this may tend to invite excessively large facilities for realizing such reduced pressure.

A treatment temperature in the replacing step under reduced pressure conditions is preferably 0° C. or higher, and more preferably 10° C. or higher. If this temperature is lower than 0° C., a mediating liquid may not sufficiently be removed, and this may result in residual second organic solvent or vacancies between fibers. When a solvent, for example, is used as the impregnating liquid, the upper limit of the temperature is preferably set to the boiling point (boiling point under the reduced pressure conditions) of the solvent. If the temperature is higher than the boiling point, the solvent may volatilize significantly, and bubbles tend to remain instead.

The impregnating liquid can also smoothly penetrate into the assembly of modified cellulose fibers by alternately repeating the application of a reduced pressure and pressurization (the application of a load) while keeping the assembly of modified cellulose fibers immersed in the impregnating liquid.

The reduced pressure condition in this case is as with the reduced pressure condition mentioned above. A pressure in the pressurization is preferably 1.1 to 10 MPa. If the pressure in the pressurization is lower than 1.1 MPa, the impregnating liquid may not sufficiently penetrate into spaces between the fibers, and the second organic solvent or vacancies may remain between fibers. In contrast, the pressure in pressurization may be set to higher than 10 MPa, but this tends to invite excessively large facilities for the pressurization.

A treatment temperature in the impregnating step under pressurization is preferably from 0° C. to 300° C., and more preferably from 10° C. to 100° C. If this temperature is lower than 0° C., the impregnating liquid may not sufficiently penetrate into spaces between the fibers, and the second organic solvent or vacancies may remain between fibers. In contrast, if the temperature is higher than 300° C., the matrix material may be degraded.

Upon the immersion of the assembly of modified cellulose fibers in the impregnating liquid, two or more plies of the assembly of modified cellulose fibers may be stacked and immersed in the impregnating liquid. In addition or alternatively, plural plies of the assembly of modified cellulose fibers after the impregnation with the impregnating liquid may be stacked and subjected to a subsequent curing step.

Matrix materials and impregnating liquids usable in the present invention will be illustrated below.

<Matrix Material>

A matrix material in a fiber-reinforced composite material according to the present invention is not particularly limited, as long as it is a material which constitutes a matrix in the fiber-reinforced composite material according to the present invention and can yield a fiber-reinforced composite material satisfying preferred properties mentioned later. For example, each of organic polymers, inorganic polymers, and hybrid polymers between organic polymers and inorganic polymers can be used alone or in combination.

Hereinafter, matrix materials suitably used in the present invention will be described by way of example; however, the matrix materials for use in the present invention are not limited thereto.

Examples of the inorganic polymers used as the matrix material include ceramics such as glass, silicate materials, and titanate materials, and they can be formed, for example, by dehydration condensation reaction of alcoholates. The organic polymers include natural polymers and synthetic polymers.

Examples of the natural polymers include regenerated cellulose-based polymers such as cellophane and triacetyl cellulose.

Examples of the synthetic polymers include vinyl resins, polycondensation resins, polyaddition resins, addition-condensation resins, and ring-opened polymers.

The vinyl resins include, for example, common resins such as polyolefins, vinyl chloride resins, vinyl acetate resins, fluorinated resins, and (meth)acrylic resins; and engineering plastics or super engineering plastics formed by vinyl polymerization. These resins may be homopolymers each formed from one type of constituent monomer or may be copolymers.

The polyolefins include, for example, homopolymers formed typically from ethylene, propylene, styrene, butadiene, butene, isoprene, chloroprene, isobutylene, or isoprene; copolymers thereof; and cyclic polyolefins having a norbornene structure.

The vinyl chloride resins include homopolymers containing, for example, vinyl chloride or vinylidene chloride, and copolymers thereof.

The vinyl acetate resins include, for example, poly(vinyl acetate) which is a homopolymer of vinyl acetate; poly(vinyl alcohol) which is a hydrolyzed product of poly(vinyl acetate); poly(vinyl acetal) which is a reaction product of vinyl acetate with formaldehyde or n-butyl aldehyde; and poly(vinyl butyral) which is a reaction product of poly(vinyl alcohol) typically with butyl aldehyde.

The fluorinated resins include homopolymers typically of tetrachloroethylene, hexafluoroethylene, chlorotrifluoroethylene, vinylidene fluoride, vinyl fluoride, or perfluoroalkyl vinyl ether, and copolymers thereof.

The (meth)acrylic resins include homopolymers typically of (meth)acrylic acid, (meth)acrylonitrile, (meth)acrylate, or (meth)acrylamide, and copolymers thereof. The "(meth)acrylic" means "acrylic and/or methacrylic". The (meth) acrylic acid herein can be acrylic acid or methacrylic acid. In addition, the (meth)acrylonitrile can be acrylonitrile or methacrylonitrile. The (meth)acrylate can be an alkyl (meth)acrylate, a (meth)acrylic acid-based monomer having a cycloalkyl group, or an alkoxyalkyl (meth)acrylate. Examples of the alkyl (meth)acrylate include methyl (meth)acrylate, ethyl (meth)acrylate, butyl (meth)acrylate, 2-ethylhexyl (meth)acrylate, cyclohexyl (meth)acrylate, benzyl (meth)acrylate, lauryl (meth)acrylate, stearyl (meth)acrylate, and hydroxyethyl (meth)acrylate. Examples of the (meth)acrylic acid-based monomer having a cycloalkyl group include cyclohexyl (meth)acrylate and isobornyl (meth)acrylate. The alkoxyalkyl(meth)acrylate includes, for example, 2-methoxyethyl (meth)acrylate, 2-ethoxyethyl (meth)acrylate, and 2-butoxyethyl (meth)acrylate. Examples of the (meth)acrylamides include (meth)acrylamide and N-substituted (meth)acrylamides such as N-methyl(meth)acrylamide, N-ethyl(meth)acrylamide, N,N-dimethyl(meth)acrylamide, N,N-diethyl(meth)acrylamide, N-isopropyl(meth)acrylamide, and N-t-octyl(meth)acrylamide.

The polycondensation resins include, for example, amide resins and polycarbonates.

The amide resins include, for example, aliphatic amide resins such as 6,6-nylon, 6-nylon, 11-nylon, 12-nylon, 4,6-nylon, 6,10-nylon, and 6,12-nylon; and aromatic amide resins produced from an aromatic diamine such as phenylene diamine and an aromatic dicarboxylic acid such as terephthaloyl chloride, isophthaloyl chloride, or a derivative thereof.

The polycarbonates are reaction products between bisphenol-A or a bisphenol as a derivative thereof, and phosgene or phenyl dicarbonate.

The polyaddition resins include, for example, ester resins, U polymers, liquid crystal polymers, poly(ether ketone) derivatives, poly(ether ether ketone)s, unsaturated polyesters, alkyd resins, polyimide resins, polysulfones, poly(phenylene sulfide)s, and poly(ether sulfone)s.

Examples of the ester resins include aromatic polyesters, aliphatic polyesters, and unsaturated polyesters. The aromatic polyesters include a copolymer of a diol, which will be described later, such as ethylene glycol, propylene glycol, or 1,4-butanediol and an aromatic dicarboxylic acid such as terephthalic acid. The aliphatic polyesters include, for example, a copolymer of a diol which will be described later and an aliphatic dicarboxylic acid such as succinic acid or valeric acid, a homopolymer of a hydroxycarboxylic acid such as glycolic acid or lactic acid or a copolymer thereof, or a copolymer of the aforementioned diol, the above aliphatic dicarboxylic acid and the above hydroxycarboxylic acid. The unsaturated polyesters include a copolymer of a diol which will be described later and an unsaturated dicarboxylic acid such as maleic anhydride, and where necessary, a vinyl monomer such as styrene may also be used.

The U polymers include a copolymer of bisphenol-A or a derivative thereof, that is, a bisphenol derivative, typically with terephthalic acid or isophthalic acid.

The liquid crystal polymers are copolymers of p-hydroxybenzoic acid typically with terephthalic acid, p,p'-dioxydiphenol, p-hydroxy-6-naphthoic acid, or poly(ethylene terephthalate).

The poly(ether ketone)s include homopolymers typically of 4,4'-difluorobenzophenone or 4,4'-dihydrobenzophenone; and copolymers thereof.

The poly(ether ether ketone)s include copolymers typically of 4,4'-difluorobenzophenone and hydroquinone.

The alkyd resins include copolymers of a higher fatty acid such as stearic acid or palmitic acid, a dibasic acid such as phthalic anhydride, and a polyol such as glycerin.

The above polysulfones include copolymers typically of 4,4'-dichlorodiphenyl sulfone and bisphenol-A.

The poly(phenylene sulfide)s include copolymers typically of p-dichlorobenzene and sodium sulfide.

The poly(ether sulfone)s include polymers of 4-chloro-4'-hydroxydiphenyl sulfone.

Examples of the polyimide resins include a pyromellitic acid polyimide which is a copolymer typically of pyromellitic anhydride and 4,4'-diaminodiphenyl ether; a trimellitic acid polyimide which is a copolymer typically of anhydrous trimellitic chloride and an aromatic diamine such as p-phenylenediamine, and a diisocyanate compound which will be described later; a biphenyl polyimide obtained typically from biphenyltetracarboxylic acid, 4,4'-diaminodiphenyl ether, and p-phenylenediamine; a benzophenone polyimide obtained typically from benzophenone tetracarboxylic acid and 4,4'-diaminodiphenyl ether; and a bismaleimide polyimide obtained typically from bismaleimide and 4,4'-diaminodiphenylmethane.

The polyaddition resins include, for example, urethane resins.

The urethane resins are copolymers of a diisocyanate and a diol. Examples of the diisocyanate include dicyclohexylmethane diisocyanate, 1,6-hexamethylene diisocyanate, isophorone diisocyanate, 1,3-cyclohexyl diisocyanate, 1,4-cyclohexyl diisocyanate, 2,4-tolylene diisocyanate, 2,6-tolylene diisocyanate, 4,4'-diphenylmethane diisocyanate, 2,41-diphenylmethane diisocyanate, and 2,2'-diphenylmethane diisocyanate. Examples of the diol include diols having a relatively small molecular weight, such as ethylene glycol, propylene glycol, 1,3-propanediol, 1,3-butanediol, 1,4-butanediol, 1,5-pentanediol, 3-methyl-1,5-pentanediol, 1,6-hexanediol, neopentyl glycol, diethylene glycol, trimethylene glycol, triethylene glycol, tetraethylene glycol, dipropylene glycol, tripropylene glycol, and cyclohexanedimethanol; polyester diols; polyether diols; and polycarbonate diols.

The addition condensation resins include, for example, phenol resins, urea resins, and melamine resins.

The phenol resins include homopolymers typically of phenol, cresol, resorcinol, phenylphenol, bisphenol A, or bisphenol F; and copolymers thereof.

The above urea resins and melamine resins are copolymers typically of formaldehyde with urea or melamine.

Examples of the above ring-opened polymers include poly(alkylene oxide)s, polyacetals, and epoxy resins. The poly(alkylene oxide)s include homopolymers typically of ethylene oxide or propylene oxide, and copolymers thereof. The polyacetals include copolymers typically of trioxane, formaldehyde, or ethylene oxide. The above epoxy resins include, for example, aliphatic epoxy resins formed of epichlorohydrin and a polyalcohol such as ethylene glycol; and aliphatic epoxy resins formed of a bisphenol A and epichlorohydrin.

Among the matrix materials for use in the present invention, amorphous synthetic resins each having a high glass transition temperature (Tg) are particularly preferred since a fiber-reinforced composite material having superior transparency and durability can be obtained. Of these, those having a degree of crystallinity of 10% or less are preferred, of which those having a degree of crystallinity of 5% or less are more preferred. The degree of crystallinity herein is an index of the degree of amorphousness. In addition, the glass transition temperature Tg is preferably 110° C. or higher, more preferably 120° C. or higher, and even more preferably 130° C. or higher. A matrix material having a glass transition temperature Tg lower than 110° C. may have a problem in durability in applications typically of transparent components and optical components. For example, when it is brought into contact with boiling water, deformation may occur. In this connection, the glass transition temperature Tg may be measured in accordance with differential scanning calorimetry (DSC), and the degree of crystallinity may be obtained by densimetry in which the degree of crystallinity is calculated from the densities of an amorphous portion and a crystalline portion.

Preferred examples of transparent matrix materials for use in the present invention include thermosetting resins such as acrylic resins, methacrylic resins, epoxy resins, urethane resins, phenol resins, melamine resins, novolac resins, urea resins, guanamine resins, alkyd resins, unsaturated polyester resins, vinyl ester resins, diallyl phthalate resins, silicone resins, furan resins, ketone resins, xylene resins, thermosetting polyimides, styrylpyridine-based resins, and triazine-based resins. Among these, acrylic resins and methacrylic resins, which have significantly superior transparency, are preferably used.

Each of these matrix materials can be used alone or in combination.

<Impregnating Liquid>

The impregnating liquid for use in the present invention may be at least one selected from a fluid matrix material, a fluid raw material of a matrix material, a fluid prepared by fluidizing a matrix material, a fluid prepared by fluidizing a raw material of a matrix material, a solution of a matrix material, and a solution of a raw material of a matrix material.

The fluid matrix material includes a matrix material having its own fluidity. The fluid raw material of a matrix material includes, for example, a polymerization intermediate such as a prepolymer or an oligomer.

The fluid prepared by fluidizing a matrix material includes, for example, a fluid obtained by heating and melting a thermoplastic matrix material.

The fluid prepared by fluidizing a raw material of a matrix material includes, for example, when a polymerization intermediate such as a prepolymer or an oligomer is in a solid state, a fluid which is obtained by heating and melting the intermediate.

As the solution of a matrix material and as the solution of a raw material of a matrix material, a solution may be mentioned in which the matrix material or the raw material thereof is dissolved typically in a solvent. This solvent may be optionally determined in accordance with a matrix material and a raw material thereof to be used; however, there is preferably selected a solvent having a boiling point lower than a certain temperature so that when the solvent is removed by evaporation in a subsequent step, the matrix material or the raw material thereof may not be degraded.

<Curing Step>

In order to cure the impregnating liquid impregnated in the fibers, curing may be performed in accordance with a curing process suitable for this impregnating liquid. For example, when the impregnating liquid is a fluid matrix material, curing can be performed, for example, by crosslinking reaction or elongation reaction. When the impregnating liquid is a fluid raw material of a matrix material, curing can be performed, for example, by polymerization reaction, crosslinking reaction, or elongation reaction.

When the impregnating liquid is a fluid prepared by fluidizing a matrix material, curing can be performed typically by cooling. When the impregnating liquid is a fluid prepared by fluidizing a raw material of a matrix material, curing can be performed, for example, by cooling in combination with polymerization reaction, crosslinking reaction, or elongation reaction.

When the impregnating liquid is a solution of a matrix material, curing can be performed, for example, through removal of a solvent in the solution by evaporation or air drying. When the impregnating liquid is a solution of a raw material of a matrix material, curing can be performed, for example, by removing a solvent in the solution in combination with polymerization reaction, crosslinking reaction, or elongation reaction. The above removal by evaporation includes removal by evaporation under reduced-pressure, in addition to removal by evaporation under atmospheric pressure.

As is described above, each of fibers can be used alone or in combination so as to constitute an assembly of modified cellulose fibers for use in the present invention. For example, a chemically modified fiber and an unmodified fiber can be used in combination; fibers subjected to different chemical modification treatments can be used in combination; or bacterial cellulose and a plant-derived Nano MFC can be used in combination. In addition, bacterial celluloses derived from different strains can be used in combination, and two or more different strains can be used upon culturing.

[Fiber-Reinforced Composite Material]

A fiber-reinforced composite material according to the present invention may have a moisture regain of 3% or less, preferably 2% or less, and more preferably 1.5% or less as measured according to the method for measuring moisture regain mentioned below. The fiber-reinforced composite material showing such low moisture absorbency can be effectively used in its applications.

[Method for Measuring Moisture Regain]

(1) A sample is left stand at 50° C. in a dry atmosphere for 24 hours, followed by weighing (dry weight $W_0$).

(2) Next, the sample is left stand in an atmosphere at a temperature of 20° C. and humidity of 60% until the weight becomes constant, followed by weighing (humid weight $W_1$).

(3) The moisture regain is determined by calculation based on the dry weight $W_0$ and the humid weight $W_1$ according to the following equation:

$$\text{Moisture regain (\%)}=(W_1-W_0)/W_0\times 100$$

Fiber-reinforced composite materials according to the present invention, in particular those manufactured through the first to fifth steps can each have an optional fiber content within a wide range of from 1 to 70 percent by weight. When the fiber content in the fiber-reinforced composite material is excessively small, improvement in flexural strength and flexural modulus by fibers or an effect of decreasing the coefficient of linear thermal expansion tends to become insufficient, and when the content is excessively large, adhesion between the fibers or filling of spaces between the fibers by the matrix material becomes insufficient, and as a result, the strength, transparency, and surface flatness may be degraded. In addition, it is not desirable from the points typically of moisture absorbency and cost as mentioned above. Accordingly, the fiber content in the fiber-reinforced composite material prepared according to the present invention is preferably 10 percent by weight or more, and particularly preferably 20 to 70 percent by weight.

A fiber-reinforced composite material according to the present invention thus obtained is desirably a highly transparent material which has a 50 μm-thick visible light transmittance at wavelengths of 400 to 700 nm of 60% or more, preferably 65% or more, more preferably 70% or more, even more preferably 80% or more, and most preferably 90% or more. When the 50 μm-thick visible light transmittance of a fiber-reinforced composite material is less than 60%, the fiber-reinforced composite material become semi-transparent or opaque, and hence the objects of the present invention may not be achieved. As a result, it may become difficult to use the composite material in various applications which require transparency, such as window materials of movable bodies including automobiles, electric trains, and ships; displays; housings; buildings; and various optical components.

The "50 μm-thick light transmittance at wavelengths of 400 to 700 nm," as used herein is obtained such that when a fiber-reinforced composite material according to the present invention is irradiated with light having wavelengths of 400 to 700 nm in a thickness direction, an average light transmittance (linear-ray transmittance, i.e., parallel-ray transmittance) in the entire wavelength region is obtained and is then converted to a value at a thickness of 50 μm. The light transmittance can be determined by disposing a light source and a detector so as to be perpendicular to a test substrate (sample substrate) which is provided therebetween, and measuring linear transmitting rays (parallel rays) using air as a reference.

A fiber-reinforced composite material according to the present invention preferably has a coefficient of linear thermal expansion of $0.05 \times 10^{-5}$ to $5 \times 10^{-5}$ K$^{-1}$, more preferably $0.2 \times 10^{-5}$ to $2 \times 10^{-5}$ K$^{-1}$, and even more preferably $0.3 \times 10^{-5}$ to $1 \times 10^{-5}$ K$^{-1}$. The coefficient of linear thermal expansion of the fiber-reinforced composite material may be less than $0.05 \times 10^{-5}$ K$^{-1}$. However, in consideration of the coefficient of linear thermal expansion typically of cellulose fibers, it may be difficult to realize the such small coefficient. On the other hand, when the coefficient of linear thermal expansion is more than $5 \times 10^{-5}$ K$^{-1}$, the fiber-reinforcing effect may not be obtained, and because of the difference in coefficient of linear thermal expansion from that of a glass or a metal material, at some ambient temperatures, flexure or strain may be generated in window materials, and image forming properties and refractive indexes of optical components may not work well as designed.

A fiber-reinforced composite material according to the present invention preferably has a flexural strength of 30 MPa or more and more preferably 100 MPa or more. When the flexural strength is less than 30 MPa, a sufficient strength may not be obtained, and as a result, the use of this composite material in applications to which forces are applied, such as structural materials, may be adversely affected. The upper limit of the flexural strength is generally about 600 MPa; however, by improvement, such as adjustment of fiber orientation, a higher flexural strength, such as 1 GPa or about 1.5 GPa, can also be expected.

A fiber-reinforced composite material according to the present invention preferably has a flexural modulus of 0.1 to 100 GPa and more preferably 1 to 40 GPa. When the flexural modulus is less than 0.1 GPa, a sufficient strength may not be obtained, and as a result, the use of this composite material in applications to which forces are applied, such as structural materials, may be adversely affected. In contrast, it is difficult to realize a flexural modulus of more than 100 GPa.

A fiber-reinforced composite material according to the present invention preferably has a thermal conductivity of 0.5 W/mK or more, more preferably 1.0 W/mK (equivalent to the thermal conductivity of quartz glass) or more, and further more preferably 1.1 W/mK or more. Such a high thermal conductivity can accelerate thermal transfer to thereby yield a member superior in heat dissipation. The thermal conductivity of a fiber-reinforced composite material according to the present invention increases with an increasing fiber content, and it can be controlled to a desired value by adjusting the fiber content.

The specific gravity of a fiber-reinforced composite material according to the present invention is preferably 1.0 to 2.5. In particular, when the matrix material used is an organic polymer other than an inorganic polymer such as a titanate compound, alumina, or a silicate compound such as a glass, or when the matrix material used is a porous material even though being an inorganic polymer, the specific gravity of a fiber-reinforced composite material according to the present invention is preferably 1.0 to 1.8, more preferably 1.2 to 1.5, and even more preferably 1.3 to 1.4. The specific gravity of matrix materials other than glass is generally less than 1.6, and in addition, the specific gravity of cellulose fibers is about 1.5. Therefore, when it is attempted to decrease the specific gravity to less than 1.0, the content typically of cellulose fibers is decreased, and improvement in strength typically by cellulose fibers tends to be insufficient. On the other hand, when the specific gravity is more than 1.8, the weight of a fiber-reinforced composite material to be obtained becomes large, and compared to a glass fiber-reinforced material, the use of the composite material may be disadvantageous in applications in which reduction in weight is attempted.

When an inorganic polymer (other than porous materials) such as a silicate compound including glass, a titanate compound, or alumina is used, the specific gravity of a fiber-reinforced composite material according to the present invention is preferably 1.5 to 2.5 and more preferably 1.8 to 2.2. Since the specific gravity of glass is generally 2.5 or more, and the specific gravity of cellulose fibers is about 1.5, when it is attempted to increase the specific gravity to 2.5 or more, the content typically of cellulose fibers is decreased, and as a result, improvement in strength typically by cellulose fibers tends to be insufficient. On the other hand, when the specific gravity is less than 1.5, the spaces between fibers may not be sufficiently filled.

The coefficient of linear thermal expansion in the present invention is a coefficient of linear thermal expansion determined by heating a fiber-reinforced composite material from 50° C. to 150° C. and carrying out measurement under the conditions in accordance with American Society for Testing and Material's Standard (ASTM) D 696. The flexural strength and flexural modulus are values measured in accordance with the methods specified in Japanese Industrial Standards (JIS) K 7203. The thermal conductivity of a fiber-reinforced composite material is a value measured according to AC calorimetry (in-plane direction). The specific gravity of a fiber-reinforced composite material can be obtained by the steps of measuring the mass per unit volume at 20° C. to obtain the density and then converting it based on the density (1.004 g/cm$^3$ (20° C.)) of water.

Since having superior transparency and low moisture absorbency and further having various superior functionalities owing to composition between the fibers and the matrix material, fiber-reinforced composite materials according to the present invention can be suitably used for various applications in various fields such as an optical field, structural material field, and building material field.

A transparent substrate composed of a fiber-reinforced composite material according to the present invention has superior transparency and can be suitably used as a material for transparent substrates for use in organic electroluminescent devices and photoreceptor devices in image sensors and solar cells. By using a transparent substrate according to the present invention, improvements are expected in performance, such as optical properties, reduction in consumed electric current, and elongation of use time, of electronic apparatuses such as digital cameras and scanners. In addition, a fiber-reinforced composite material according to the present invention can be formed into an optical fiber.

EXAMPLES

Hereinafter, the present invention will be illustrated in further detail with reference to manufacturing examples, examples, and comparative examples; however, the following examples are not limitative at all, as long as being within the scope and spirit of the present invention.

Measurement methods for the moisture regains, fiber content, transmittances, and coefficients of linear thermal expansion of fiber-reinforced composite materials are described below.

[Measurement of Moisture Regain]

i) A sample was left stand at 50° C. in a dry atmosphere for 24 hours, followed by weighing (dry weight $W_0$).

ii) Next, the sample was left stand in an atmosphere at a temperature of 20° C. and humidity of 60% until the weight became constant, followed by weighing (humid weight $W_1$).

iii) The moisture regain was determined by calculation based on the dry weight $W_0$ and the humid weight $W_1$ according to the following equation:

$$\text{Moisture regain (\%)} = (W_1 - W_0)/W_0 \times 100$$

[Measurement of Fiber Content]

The fiber content was determined based on the weight of a manufactured fiber-reinforced composite material, and the weight of an assembly of modified cellulose fibers used in the manufacturing of the fiber-reinforced composite material.

[Measurement of Transmittance]

<Measurement Apparatus>

"UV-4100 spectrophotometer" (solid sample measurement system) supplied from Hitachi High-Technologies Corp. was used.

<Measurement Conditions>

A light-source mask having a size of 6 mm by 6 mm was used.

A test sample was placed at a position 22 cm apart from an opening of an integrating sphere, and photometry was performed. Since the sample is placed at the above position, diffuse transmission light is removed, and only linearly transmitted light directly reaches a light-receiving portion inside the integrating sphere.

A reference sample was not used. Since the reference was not present, a loss in transmittance caused by the Fresnel reflection occurred. The reference herein is reflection caused by the difference in refractive index between the sample and air. When the Fresnel reflection occurs, a linear transmittance of 100% cannot be obtained.

Scanning speed: 300 nm/min

Light source: tungsten lamp, heavy hydrogen lamp

Light source switching: 340 nm

[Measurement of Coefficient of Linear Thermal Expansion]

On a test sample after heating at 60° C. in a nitrogen atmosphere for 2 hours for postcure of the resin, measurement was performed by a method in accordance with ASTM D 696 under the following conditions by using "TMA/SS6100" supplied from Seiko Instrument Inc.

<Measurement Conditions>

Temperature rising rate: 5° C./min

Atmosphere: $N_2$ atmosphere

Heating temperature: 20° C. to 150° C.

Load: 3 g

Times of measurement: 3 times

Length of sample: 4×15 mm

Thickness of sample: various thicknesses depending on samples

Mode: tensile mode

[Method for Determining Degree of Chemical Modification of Assembly of Modified Cellulose Fibers Derived from Hydrated Cellulose Fiber Assembly]

1) A test sample after chemical modification was cut into two pieces (1.5×4.5 cm) with scissors.

2) The cut test sample was immersed in acetone with stirring to thereby replace a reaction liquid in the test sample with acetone.

3) The acetone-replaced test sample was placed on glass, followed by air drying. The test sample was dried within about 30 minutes to be a thin sheet having a thickness of about 1 mm. By drying gradually on plate glass, a smooth side was obtained.

4) The test sample was then dried at 100° C. under reduced pressure for 1 hour to thereby remove the reaction liquid remained inside the assembly completely.

5) Smooth sides of two pieces of the acetone-replaced test sample were brought in intimate contact with both sides of an attenuated total reflectance (ATR) prism, respectively.

6) The prism bearing the acetone-replaced test sample in intimate contact was mounted to a total reflectance measurement instrument (attenuated total reflectance (ATR) attachment, ATR-8000, supplied from Shimadzu). As the ATR prism, KRS-5 using thallium bromide and thallium iodide was used.

7) The ATR attachment was mounted to a Fourier transform infrared spectrometer (FT-IR, FTIR-8600PC, supplied from Shimadzu), followed by measurement. The measurement was conducted under conditions of an incident angle of infrared radiation into the prism of 45°, a number of reflection times of infrared radiation in the prism of 45 times, a spectral resolution of 4 $cm^{-1}$, and a number of integration times of 100. As a result of the measurement under these conditions, information of a BC sheet in a region from the contact interface with the prism to a depth of 1.15 μm was obtained.

8) The absorption intensity of a peak at 1319 $cm^{-1}$ (derived from $CH_2$ deformation vibration of cellulose) in the obtained spectrum was standardized to be 1.

9) A test sample not subjected to chemical modification was subjected to the ATR measurement in the same manner, and the obtained spectrum was standardized on a peak at 1319 $cm^{-1}$.

10) A difference spectrum was determined by subtracting the spectrum in (9) from the spectrum in (8).

11) A peak area of from 1701 $cm^{-1}$ to 1772 $cm^{-1}$ with a peak top at 1745 $cm^{-1}$ (derived from C=O stretching vibration) in the difference spectrum was determined.

Figure 2:
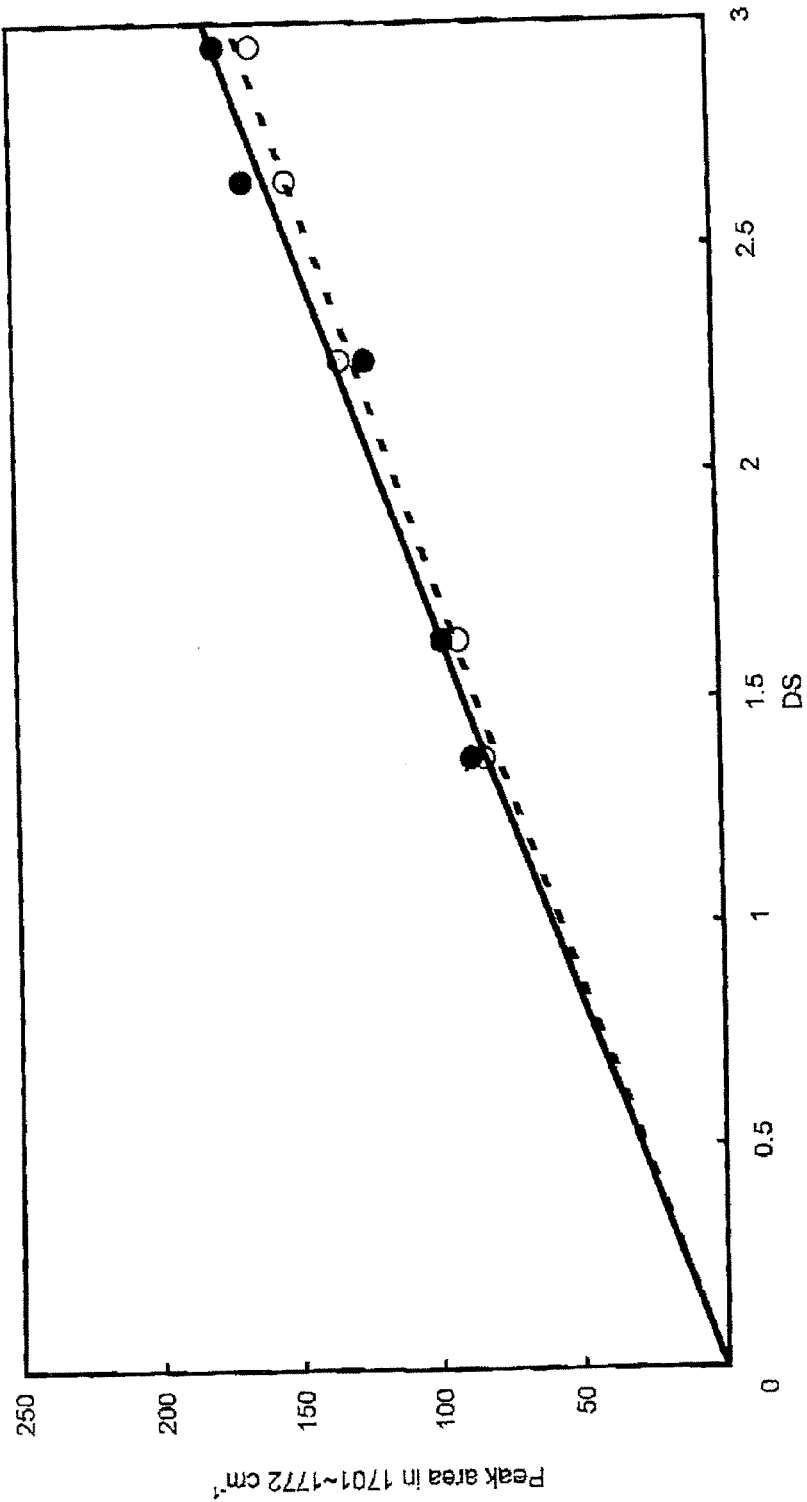
FIG. 2 is a graph showing a standard curve used in the calculation of a degree of chemical modification.

12) A degree of chemical modification was calculated by applying the obtained peak area to the standard curve in FIG. 2. The term "DS" corresponding to the abscissa in FIG. 2 refers to the degree of substitution and indicates that how many of hydroxy groups per anhydrous glucose unit of cellulose are substituted with another functional group. Since having three hydroxy groups per anhydrous glucose unit, cellulose has a degree of substitution of at most 3. For example, cellulose not subjected to chemical modification has a degree of substitution of 0, and cellulose triacetate has a degree of substitution of 3. The degree of chemical modification can therefore be converted from the degree of substitution according to the following equation:

$$\text{Degree of chemical modification (percent by mole)} = (\text{Degree of substitution})/3 \times 100$$

[Method for Determining Degree of Chemical Modification of Modified Cellulose Fiber Assembly Derived from Dried Cellulose Fiber Assembly]

(1) A dried cellulose fiber assembly was dried at 100° C. at a reduced pressure of about 0.133 kPa (1 mmHg) to 1.33 kPa (10 mmHg) for 1 hour, followed by weighing (weight before treatment $W_0$).

(2) The dried cellulose fiber assembly was subjected to chemical modification, was continuously washed with methanol, running water, and distilled water, and was dried at 100° C. at a reduced pressure of about 0.133 kPa (1 mmHg) to 1.33 kPa (10 mmHg) for 1 hour, followed by weighing (weight after chemical modification $W_1$), (3) A degree of chemical modification of the assembly of modified cellulose fibers derived from dried cellulose fiber assembly was calculated based on the weight before treatment $W_0$ and the weight after chemical modification $W_1$ according to the following equation:

Degree of chemical modification (percent by mole)=
[($W_1-W_0$)/((Molecular weigh of functional group to be introduced)−1.008)]/($W_0$/162.14×3)×100

Manufacturing Example 1

<Manufacturing of Hydrated Bacterial Cellulose>

After a culture fluid was added to a strain of acetic acid bacteria stored in a freeze-dried state, stationary culture was performed at 25° C. to 30° C. for 1 week. On the surface of the culture fluid, bacterial cellulose was produced, and after a relatively thick part of the bacterial cellulose thus produced was selected, a small amount of a culture fluid of that strain was sampled and then added to a new culture fluid. Subsequently, this culture fluid was placed in a large incubator, followed by stationary culture at 25° C. to 30° C. for 7 to 30 days. The culture fluid used was an aqueous solution (SH culture medium) having a pH of 5.0 adjusted by hydrochloric acid and containing 2 percent by weight of glucose, 0.5 percent by weight of bactoyeast extract, 0.5 percent by weight of bactopeptone, 0.27 percent by weight of disodium hydrogen phosphate, 0.115 percent by weight of citric acid, and 0.1 percent by weight of magnesium sulfate heptahydrate.

The bacterial cellulose thus produced was recovered from the culture fluid and was then boiled in a 2 percent by weight alkaline aqueous solution for 2 hours. Subsequently, after the bacterial cellulose was recovered from the alkaline aqueous solution, washing was performed sufficiently to remove the alkaline aqueous solution, so that bacteria in the bacterial cellulose were removed by dissolution to yield a hydrated bacterial cellulose having a thickness of 1 cm, a fiber content of 1 percent by volume, and a water content of 99 percent by volume.

This hydrated bacterial cellulose was subjected to cold pressing at room temperature at 2 MPa for one minute to remove water. Thus, a sheet having a thickness of 1 mm was obtained.

Manufacturing Example 2

<Manufacturing of Dried Bacterial Cellulose>

The hydrated bacterial cellulose after cold pressing in Manufacturing Example 1 was subjected to hot pressing at 120° C. at 2 MPa for 4 minutes to thereby yield a dried bacterial cellulose.

Manufacturing Example 3

<Manufacturing of Nano MFC>

After microfibrillated cellulose (MFC; obtained by microfibrillation of nadelholz bleached kraft pulp (NBKP) using a high pressure homogenizer, having an average fiber diameter of 1 μm) was sufficiently stirred with water to prepare 7 kg of an aqueous suspension at a concentration of 1 percent by weight, this aqueous suspension was allowed to repeatedly pass between two rotating discs of a grinder (supplied under the trade name "Pure Fine Mill KMG1-10" from Kurita Machinery Mfg. Co., Ltd.) from the center to the outside 30 times (30 passes), the two discs being substantially in contact with each other and at the disc revolution speed of 1200 rpm.

From Nano MFC (average fiber diameter of 60 nm) obtained by the grinding treatment, an aqueous suspension at a concentration of 0.2 percent by weight was prepared, followed by filtration using a glass filter, followed by film formation. This film was dried at 55° C., so that a Nano MFC sheet having a fiber content of about 70% and a thickness of 43 μm was obtained.

Examples 1 to 6 and Comparative Example 1 for Verifying Reduction in Moisture Regain by Acetylation Example 1

A dried bacterial cellulose sheet (10 cm long and 10 cm wide) manufactured according to Manufacturing Example 2 was immersed in a reaction liquid containing acetic anhydride and acetic acid in a ratio of 9:1 (by volume) placed in a petri dish, followed by impregnation of the BC sheet with the reaction liquid deep inside thereof. The impregnation was conduced in a desiccator at room temperature under reduced pressure of 1 kPa for 30 minutes. The pressure was raised to normal pressure, and the impregnated sheet was left stand in a dark place at room temperature in a nitrogen gas ($N_2$) atmosphere for 11 days for carrying out chemical modification treatment.

The chemically modified bacterial cellulose sheet was recovered, was washed with methanol, running water, and distilled water, and was dried at 60° C. under reduced pressure for 1 hour.

The degree of chemical modification of the obtained chemically modified bacterial cellulose sheet was determined, and the result is shown in Table 2.

This chemically modified bacterial cellulose sheet was rinsed with methanol, running water, and distilled water to remove the reaction liquid, was dried, was immersed and left stand in a monomer solution for ultraviolet-curable acrylic resin, TCDDMA, supplied from Mitsubishi Chemical Corporation at room temperature and a reduced pressure of 0.09 MPa overnight, so as to impregnate the sheet with the monomer solution. The bacterial cellulose impregnated with the monomer solution was pinched between a pair of slide glass, and was irradiated with ultraviolet rays at 20 J/cm$^2$ for 8 minutes to thereby cure the resin. This was further subjected to post-curing at 160° C. in a nitrogen atmosphere for 2 hours. Thus, a fiber-reinforced composite material was manufactured.

The fiber content and moisture regain of the resulting fiber-reinforced composite material were determined, and the results are shown in Table 2.

Examples 2 to 5

The chemical modification was carried out and fiber-reinforced composite materials were manufactured by the procedure of Example 1, except for employing the reaction liquids and reaction conditions in Table 2, respectively. The results are shown in Table 2.

Example 6

The chemical modification was carried out and fiber-reinforced composite materials were manufactured by the procedure of Example 1, except for using the dried Nano MFC used in Manufacturing Example 3, instead of the dried bacterial cellulose. The results are shown in Table 2.

Comparative Example 1

A fiber-reinforced composite material was manufactured by the procedure of Example 1, except that chemical modification was not conducted. The results are shown in Table 2

TABLE 2

| Sample | Cellulose fiber assembly | Reaction liquid (ratio by volume) | Reaction temperature (° C.) | Reaction time (day) | Degree of chemical modification (%) | Fiber content (%) | Moisture regain (%) |
|---|---|---|---|---|---|---|---|
| Example 1 | Bacterial cellulose | acetic anhydride/acetic acid = 9/1 | r.t. | 11 | 5.6 | about 60 | 2.15 |
| Example 2 | Bacterial cellulose | acetic anhydride/pyridine = 2/1 | r.r. | 11 | 21.0 | about 60 | 1.26 |
| Example 3 | Bacterial cellulose | acetic anhydride/pyridine = 2/1 | 50 | 16 | 38.4 | about 60 | 1.2 |
| Example 4 | Bacterial cellulose | acetic anhydride/pyridine = 2/1 | 35 | 8 | 15.8 | about 60 | 1.03 |
| Example 5 | Bacterial cellulose | acetic anhydride/pyridine = 2/1 | 35 | 8 | 19.7 | about 60 | 1.04 |
| Example 6 | Nano MFC | acetic anhydride/acetic acid = 9/1 | r.t. | 11 | 7.2 | about 60 | 1.87 |
| Comparative Example | Bacterial cellulose | — | — | — | 0.0 | about 60 | 3.06 |

Table 2 demonstrates that the acetylation of hydroxy groups of cellulose fibers reduces the moisture regain of fiber-reinforced composite materials.

Examples 7 to 11 for Verifying Reduction in Moisture Regain by Methacryloylation and Acetylation Examples 7 to 11

Chemical modification and manufacturing of fiber-reinforced composite materials were carried out by the procedure of Example 2, except for carrying out methacryloylation with methacrylic anhydride prior to the acetylation with acetic anhydride. The results are shown in Table 3.

The reaction liquids and reaction conditions used in the methacryloylation and acetylation are shown in Table 3. In any case, treatment was conducted by immersing and leaving stand a sample bacterial cellulose sheet in a reaction liquid.

the chemical modification effect of hydroxyl groups of the cellulose fibers, act to prevent the entry of water.

Examples 12 to 16 on Chemical Modification Through Organic Solvent Replacement

Example 12

A hydrated bacterial cellulose prepared according to Manufacturing Example 1 was immersed in acetone at room temperature under normal pressure so as to replace water in the hydrated bacterial cellulose with acetone. The acetone-containing bacterial cellulose was then immersed in a reaction liquid (a 1:2 (by volume) mixture of acetic anhydride and pyridine) in a petri dish, and the petri dish was placed in a desiccator at 35° C. under reduced pressure for one hour so as to replace acetone in the bacterial cellulose with the reaction liquid. After raising the pressure to normal pressure, the article was left stand in a dark place at 60° C. in a nitrogen (N2) atmosphere so as to carry out acetylation.

TABLE 3

| | | Acetylation | | | Methacryloylation | | | Degree of chemical modification (% by mole) | | Fiber-reinforced composite material | |
|---|---|---|---|---|---|---|---|---|---|---|---|
| Sample | Cellulose fiber assembly | Reaction liquid (methacrylic anhydride/ pyridine; volume ratio) | Reaction temperature (° C.) | Reaction time (day) | Reaction liquid (methacrylic anhydride/ pyridine; volume ratio) | Reaction temperature (° C.) | Reaction time (day) | Methacryloyl group | Acetyl group | Fiber content (%) | Moisture regain (%) |
| Example 7 | Bacterial cellulose | 1/4 | 50 | 11 | — | — | — | 6.6 | — | about 60 | 1.64 |
| Example 8 | Bacterial cellulose | 1/4 | 35 | 4 | 2/1 | 35 | 4 | 5.8 | 9.0 | about 60 | 0.88 |
| Example 9 | Bacterial cellulose | 1/4 | 35 | 4 | 2/1 | 35 | 4 | 5.7 | 6.3 | about 60 | 1.19 |
| Example 10 | Bacterial cellulose | 1/3 | r.t. | 19 | 2/1 | r.t. | 8 | 9.2 | 15.3 | about 60 | 0.79 |
| Example 11 | Bacterial cellulose | 1/3 | r.t. | 13 | 2/1 | r.t | 14 | 7.8 | 15.3 | about 60 | 0.8 |

Table 3 demonstrates that the methacryloylation carried out in combination with the acetylation further reduces the moisture regain. This is probably because the cellulose fibers and the resin firmly bond with each other at their interfaces through the introduced methacryloyl groups; and this firm bond between the cellulose fibers and the resin, together with <Comparison of Reaction Rates>

Part of the bacterial cellulose was periodically sampled, the degrees of chemical modification of the samples were measured, and how the degree of chemical modification varies depending on the reaction time was determined. The results are shown in Table 4. Table 4 also shows how the degree of chemical modification varies depending on the reaction time when the reaction was carried out according to the procedure of Example 3. The reaction conditions and degrees of chemical modification are summarized in Table 5.

TABLE 4

| Reaction time (day) | Degree of chemical modification (% by mole) | |
|---|---|---|
| | Example 12 | Example 5 |
| 0 | 0 | 0 |
| 2 | 19.4 | 9.0 |
| 4 | 20.9 | 13.5 |
| 8 | — | 19.7 |
| 9 | 20.7 | — |

Table 4 demonstrates that the degree of chemical modification after 2-day reaction reached about 20 percent by mole by immersing the acetone-containing bacterial cellulose in the reaction liquid. This is probably because well-swollen bacterial cellulose structurally includes a multiplicity of gaps, thereby has a larger surface area of cellulose microfibrils, contains a larger amount of the reaction liquid inside thereof, and thereby has a higher reaction rate, as compared to a dried bacterial cellulose. The degree of chemical modification did not so significantly change even after the reaction was conducted for 9 days. This indicates that the acetylation of cellulose microfibril surfaces probably completed (became saturated) at a degree of chemical modification of about 20 percent by mole.

Examples 13 and 14

Chemical modification and manufacturing of fiber-reinforced composite materials were carried out by the procedure of Example 12, except for employing the reaction liquids and the reaction conditions in Table 5. The results are shown in Table 5.

Example 15

Chemical modification and manufacturing of a fiber-reinforced composite material were carried out by the procedure of Example 12, except for carrying out methacryloylation with methacrylic anhydride prior to the acetylation with acetic anhydride. The results are shown in Table 5.

materials were examined on how the moisture regain varies depending on the fiber content, and the results are shown in FIG. 1.

FIG. 1 demonstrates that, while the moisture regain increases with an increasing fiber content, the samples using acetylated bacterial cellulose showed lower moisture regains than those of the sample using bacterial cellulose without acetylation; and that the samples according to Example 12 showed a reduced moisture regain of about 0.5% at a fiber content of 30 to 40 percent by weight and showed a reduced moisture regain of about 0.4% at a fiber content of about 15 percent by weight.

<Effect of Chemical Modification as Observed in Linear-Ray Transmittance>

Comparative Example 3

Figure 3:
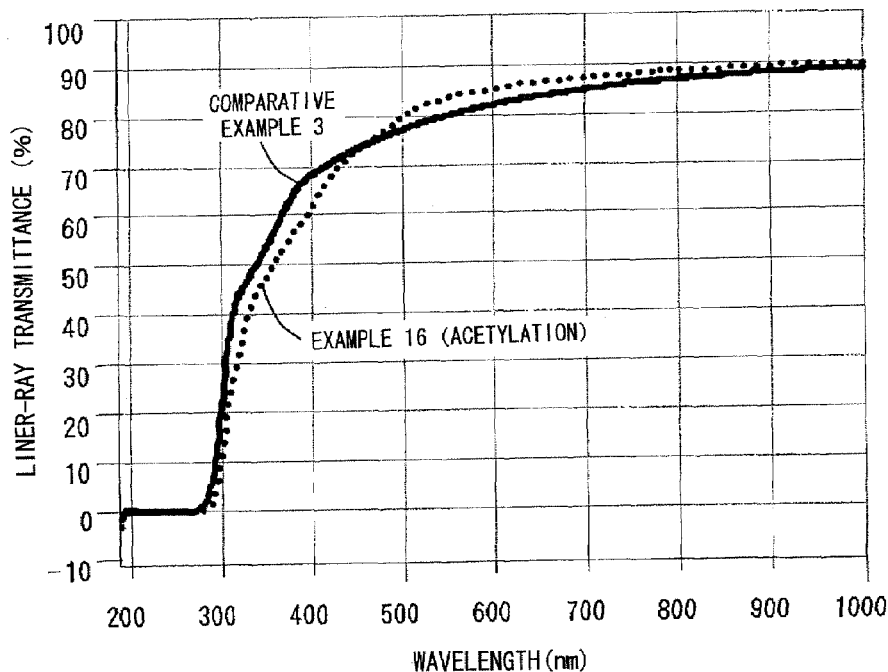
FIG. 3 is a graph showing how the average linear-ray transmittance of a fiber-reinforced composite material varies depending on the wavelength of the ray.

Bacterial cellulose impregnated with isopropanol was subjected to cold pressing under pressurization (under load) of 20 MPa for 2 minutes and was then impregnated with a TCD-DMA resin solution at room temperature under reduced pressure of −0.09 MPa overnight. The resulting resin-impregnated bacterial cellulose was irradiated with ultraviolet rays for 8 minutes at a total irradiance of 20 J/cm² to cure the resin. Thus, a fiber-reinforced composite material having a thickness of 145 μm and a fiber content of 33 percent by weight was obtained. The linear-ray transmittance of this fiber-reinforced composite material was measured, and the result is shown in FIG. 3.

Example 16

A bacterial cellulose chemically modified by the procedure of Example 12 was subjected to replacement with ethanol solvent. The resulting chemically modified bacterial cellulose was dried through hot pressing at 120° C. under pressurization of 2 MPa for 4 minutes, and was immersed in TCDDMA resin solution, followed by impregnation at room temperature and a reduced pressure of −0.09 MPa overnight. The article was subsequently irradiated with ultraviolet rays for 8 minutes at a total irradiance of 20 J/cm² so as to cure the resin. Thus, a fiber-reinforced composite material having a thickness of 145 μm and a fiber content of 33 percent by weight was obtained. The linear-ray transmittance of this fiber-reinforced composite material was measured, and the result is shown in FIG. 3.

TABLE 5

| Sample | | Reaction liquid (volume ratio) | Reaction temperature (° C.) | Reaction time (day) | Degree of chemical modification (%) |
|---|---|---|---|---|---|
| Example | 12 | Acetic anhydride/pyridine = 1/2 | 60 | 9 | 20.7 |
| | 13 | Acetic anhydride/pyridine = 1/1 | r.t. | 15 | 15.6 |
| | 14 | Acetic anhydride/pyridine = 1/1 | r.t. | 15 | 15.6 |
| | 15 | Methacrylic anhydride/pyridine = 1/2, Acetic anhydride/pyridine = 1/2 | 60 | Mathacryloylation: 7 days, Acetylation: 4 days | Methacryloylation: 11.9%, Acetylation: 4.6% |

<Relationship Between Fiber Content and Moisture Regain>

Next, the modified bacterial celluloses obtained according to Examples 12 to 15 were pressed to suitable thicknesses, and fiber-reinforced composite materials having optional fiber contents were manufactured using them by the procedure of Example 1. In addition, fiber-reinforced composite materials having optional fiber contents were manufactured using bacterial cellulose without chemical modification (Comparative Example 2). These fiber-reinforced composite Comparative Example 3 and Example 16 differ from each other in the presence or absence of chemical treatment and in the solvents used (isopropanol and ethanol) in the manufacturing methods. Almost all of such organic solvents vaporize upon injection of TCDDMA resin solution into bacterial cellulose under reduced pressure and do not affect the transparency of fiber-reinforced composite materials. Accordingly, as is demonstrated in FIG. 3, the chemical modification improves transparency particularly at wavelengths of 450 to 800 nm. Comparative Example 3 without modification had an average linear-ray transmittance at wavelengths of 400 to 800 nm of 80.5%, whereas Example 16 which had been subjected to acetylation had an average linear-ray transmittance of 82.1%.

Examples 17 to 22 for Evaluating Effect of Chemical Modification (Acylation) on Water Wettability of Bacterial Cellulose Examples 17 to 22

A hydrated bacterial cellulose obtained according to Manufacturing Example 1, which had been subjected to cold pressing at room temperature at 2 MPa for one minute to remove water and to have a thickness of 1 mm, was immersed in acetone so as to replace spaces inside the bacterial cellulose with acetone.

A reaction liquid was prepared by mixing the acid anhydride and sodium acetate or another agent shown in Table 6 in proportions in Table 6 in a separable flask. The acetone-replaced bacterial cellulose was immersed in the reaction liquid, a Dimroth condenser was attached to the separable flask, and a reaction (acylation) was carried out at the temperatures for the time periods each shown in Table 6.

After the completion of reaction, the acylated bacterial cellulose was rinsed with running water for 10 minutes, and was dipped in 100 mL of methanol for 10 minutes so as to wash the bacterial cellulose. This washing procedure was carried out a total of two times.

The degrees of chemical modification of the resulting acylated bacterial celluloses were measured, and the results are shown in Table 6. The appearances of the samples were observed, and the water wettability thereof was evaluated according to the following method. The results are shown in Table 6.

<Evaluation of Water Wettability>

The washed acylated bacterial cellulose was air-dried on a glass plate and was dried at 100° C. under reduced pressure for 1 hour. A water droplet of 10 µL was dropped onto the acylated bacterial cellulose with a microsyringe, and the dropped water droplet was visually observed 1 minute later.

pyridine, and the reaction using sodium acetate could be carried out at higher temperatures.

A comparison between Example 20 and Example 21 reveals that a larger amount of acyl group can be introduced a reaction carried out at 120° C. for 0.9 days than that in a reaction carried out at 90° C. for 4 days.

The evaluation of wettability demonstrates that, although having the same appearance, the surface water wettability of the acylated bacterial celluloses significantly varies depending on the carbon number of introduced acyl group, and that the contact angle visually apparently increases with an increasing carbon number of introduced acyl group. This is probably because the surfaces of bacterial cellulose fibrils become hydrophobic with an increasing carbon number of side chain.

Examples 23 to 32 for Evaluating Properties of Chemically Modified (Acylated) Fiber-Reinforced Composite Materials Examples 23 to 32

A hydrated bacterial cellulose obtained according to Manufacturing Example 1, which had been subjected to cold pressing at room temperature at 2 MPa for one minute to remove water and to have a thickness of 1 mm, was immersed in acetone so as to replace spaces inside the bacterial cellulose with acetone.

A reaction liquid was prepared by mixing the acid anhydride and sodium acetate or another agent in the proportions each shown in Table 7 in a separable flask. The acetone-replaced bacterial cellulose was immersed in the reaction liquid, a Dimroth condenser was attached to the separable flask, and a reaction (acylation) was carried out at the temperature for the time period each shown in Table 7

After the completion of reaction, the acylated bacterial cellulose was rinsed with running water for 10 minutes, and was dipped in 100 mL of methanol for 10 minutes so as to wash the bacterial cellulose. This washing procedure was carried out a total of two times.

TABLE 6

| | Reaction liquid | | | | | Chemical modification | | | |
|---|---|---|---|---|---|---|---|---|---|
| | Acid anhydride | | Amount of sodium acetate (g) | | Reaction condition | | Degree of chemical modification (% by mole) | | |
| Example | Type | Amount (mL) | | Others | Temperature (° C.) | Time (day) | Introduced group | | Appearance*[1] | Water wettability*[2] |
| 17 | Acetic anhydride | 100 | 5 | | 120 | 0.7 | Acetyl group | 31 | ○ | + |
| 18 | Acetic anhydride | 120 | 5 | | 110 | 6 | Acetyl group | 32 | ○ | + |
| 19 | Propionic anhydride | 10 | 2 | Toluene 110 mL | 120 | 0.7 | Propanoyl group | 15 | ○ | ++ |
| 20 | Propionic anhydride | 50 | 2 | | 120 | 0.9 | Propanoyl group | 18 | ○ | ++ |
| 21 | Propionic anhydride | 50 | 2 | | 90 | 4 | Propanoyl group | 17 | ○ | ++ |
| 22 | Butanoic anhydride | 50 | 2 | | 120 | 1 | Butanoyl group | 15 | ○ | +++ |

*[1]There is no coloring, and no difference is found in appearance from untreated bacterial cellulose.
*[2]An increasing number of "+" indicates a decreasing wettability and an increasing contact angle of water droplet.

Table 6 demonstrates that any of the acylated bacterial celluloses did not undergo coloring as a result of acylation and had an appearance equivalent to that of the untreated bacterial cellulose.

These examples show higher degrees (amounts) of introduced acyl groups as a result of chemical modification than that of Example 12 using pyridine as a catalyst, demonstrating that a higher reactivity is obtained in the reaction using sodium acetate as a catalyst than that in the reaction using pyridine as a catalyst. This is probably because sodium acetate may invite less coloring upon reaction as compared to The degrees of chemical modification of the resulting acylated bacterial celluloses were measured, and the results are shown in Table 7.

Each of the acylated bacterial celluloses was subjected to pressing at 120° C. at a pressure of 2 MPa for 4 minutes and was then immersed in the same ultraviolet-curable acrylic resin monomer solution (TCDDMA) as in Example 1, followed by standing for 12 hours. The resin-impregnated acylated bacterial cellulose was irradiated with ultraviolet rays by the procedure of Example 1 so as to cure the resin.

The resin-impregnated bacterial cellulose sheets according to Examples 28 to 32 were subjected to pressing at room temperature at a pressure of 2 MPa for 12 hours, followed by irradiation with ultraviolet rays.

The resulting fiber-reinforced composite materials were measured on fiber content, thickness, average linear-ray transmittance in visible ray regions at wavelengths of 400 to 800 nm, and moisture regain, and the results are shown in Table 7.

These fiber-reinforced composite materials were subjected to the following thermogravimetry to evaluate their thermal stabilities, and the results are shown in Table 7.

<Measuring Method in Thermogravimetry>

Measuring instrument: 2950 TGA (supplied from TA Instruments)

Measuring Conditions:

Temperature elevation condition: A sample was raised in temperature to 110° C., was maintained at the same temperature for 10 minutes, and was raised in temperature to 500° C. at a rate of 10° C./minute.

Atmosphere: under nitrogen gas stream

Sample weight: 2 mg the reaction liquid on the bacterial cellulose. Regarding the correlation between the reaction temperature and the average linear-ray transmittance or moisture regain upon chemical modification through acylation, the average linear-ray transmittance increases but the moisture regain decreases with an increasing reaction temperature. This is probably because, with an increasing reaction temperature, the degree of introduction of acyl group increases, namely, the degree of chemical modification increases, so as to protect hydroxyl groups of cellulose and to further suppress adsorption of water; and the introduction of acyl group makes the surfaces of cellulose microfibrils hydrophobic, and this increases the compatibility (miscibility) between the cellulose microfibrils and the resin.

The results of Examples 23 to 27 demonstrate that the thickness of the resulting fiber-reinforced composite material increases with an elongating side chain of acyl group. This is probably because the cohesive force between fibrils is decreased as a result of hydrophobic conversion of the surfaces of bacterial cellulose microfibrils, and the approach between fibrils is prevented due to the introduction of a bulky acyl group.

TABLE 7

| | | Reaction liquid | | | | Reaction condition | | | Chemical modification |
|---|---|---|---|---|---|---|---|---|---|
| | | Amount | Catalyst | | | Time | Temperature | | Degree of chemical modification |
| Example | Acid anhydride | (mL) | Type | Amount | Others | (hour) | (° C.) | Introduced group | (% by mole) |
| 23 | Acetic anhydride | 100 | Sodium acetate | 2 g | | 12 | 90 | Acetyl group | 22 |
| 24 | Acetic anhydride | 100 | Sodium acetate | 2 g | | 12 | 100 | Acetyl group | 23 |
| 25 | Acetic anhydride | 100 | Sodium acetate | 2 g | | 12 | 110 | Acetyl group | 32 |
| 26 | Propionic anhydride | 100 | Sodium acetate | 2 g | | 12 | 110 | Propanoyl group | 18 |
| 27 | Butanoic anhydride | 100 | Sodium acetate | 2 g | | 12 | 110 | Butanoyl group | 14 |
| 28 | Propionic anhydride | 100 | Sodium acetate | 2 g | | 12 | 110 | Propanoyl group | 18 |
| 29 | Butanoic anhydride | 100 | Sodium acetate | 2 g | | 12 | 110 | Butanoyl group | 14 |
| 30 | Butanoic anhydride | 200 | Sodium acetate | 5 g | | 60 | 120 | Butanoyl group | 15 |
| 31 | Acetic anhydride | 60 | Perchloric acid | 0.2 mL | Toluene 50 mL | 1 | room temperature | Acetyl group | 95 |
| 32 | Propionic anhydride | 30 | Perchloric acid | 0.02 mL | Toluene 30 mL | 1 | room temperature | Propanoyl group | 55 |

| | Fiber-reinforced composite material | | | | |
|---|---|---|---|---|---|
| Example | Fiber content (%) | Average linear-ray transmittance (%) | Thickness (µm) | Moisture regain (%) | Thermal stability (° C.) |
| 23 | 19 | 80 | 280 | 0.56 | 364 |
| 24 | 19 | 83 | 200 | 0.52 | 364 |
| 25 | 21 | 88 | 160 | 0.5 | 365 |
| 26 | 6 | 83 | 780 | 0.37 | 374 |
| 27 | 6 | 82 | 800 | 0.38 | 380 |
| 28 | 12 | 86 | 295 | 0.45 | 374 |
| 29 | 15 | 84 | 362 | 0.48 | 380 |
| 30 | 18 | 86 | 285 | — | 381 |
| 31 | 20 | 55 | 200 | 0.4 | |
| 32 | 20 | 86 | 220 | 0.4 | |

Table 7 demonstrates as follows.

As is described above, the use of sodium acetate as a catalyst enables a reaction at a higher temperature, because sodium acetate does not invite yellowing and deposition of The propanoylated fiber-reinforced composite material and the butanoylated fiber-reinforced composite material have substantially equivalent average linear-ray transmittances to that of the acetylated fiber-reinforced composite material, although they have thicknesses as large as about 4 times that of the acetylated fiber-reinforced composite material.

The thermal stability of a bacterial cellulose is improved as a result of chemical modification, and the degree of improvement in thermal stability increases with an increasing length of side chain of the introduced acyl group.

In the infrared spectra of the acylated bacterial celluloses obtained according to Example 24 and Example 31, the spectrum of Example 31 shows a higher (larger) peak at around 1745 $cm^{-1}$ derived from carbonyl group than that of Example 24. This demonstrates that it is effective to use perchloric acid as a catalyst in the acylation reaction of bacterial cellulose.

[Determination and Comparison of Various Properties]
<Effect of Chemical Modification Observed in Haze>

Figure 4:
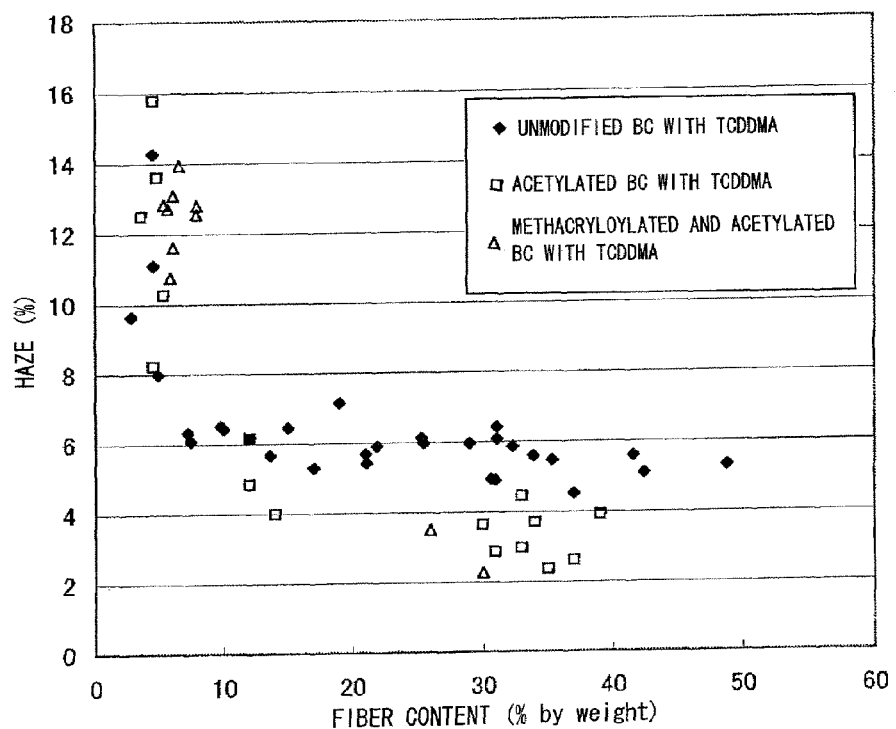
FIG. 4 is a graph showing how the haze of a fiber-reinforced composite material varies depending on the fiber content thereof.

A series of chemically unmodified fiber-reinforced composite materials having different fiber contents was prepared using the organic solvent replacing process. In addition, chemically-modified fiber-reinforced composite materials having fiber contents of about 30% to about 40% were prepared by forming dried sheets of chemically modified bacterial cellulose and subjecting the dried sheets to resin impregnation or by carrying out chemical modification of dried bacterial cellulose and subjecting the chemically modified dried bacterial cellulose to resin impregnation. Those having fiber contents of about 5% to about 15% were prepared by subjecting chemically modified bacterial cellulose to resin impregnation according to the organic solvent replacing process. Next, fiber-reinforced composite materials having optional fiber contents were manufactured by using bacterial cellulose undergone various chemical modification treatments, and chemically unmodified bacterial cellulose. The effects of chemical modification as observed upon haze were determined, and the results are shown in FIG. 4. The "haze (haze value)" herein refers to the percentage of transmitted light which has deflected from the incident light due to forward scattering, to the total transmitted light which is transmitted through a test piece. For the sake of convenience, the haze is determined according to the following equation:

Haze=(Diffused transmittance)/(Total light transmittance)×100=[(Total light transmittance)−(Linear-ray transmittance)]/(Total light transmittance)×100

The "total light transmittance" indicates how much of light perpendicularly coming into a test sample travels through the test sample. The "linear-ray transmittance" indicates the ratio of light linearly travels through a test sample to the light coming into the test sample perpendicularly. The "diffused transmittance" indicates the ratio of light which transmits with diffusion to the light coming into the test sample perpendicularly. The linear-ray transmittance was measured according to the same process as above.

The total light transmittance was measured by placing a test sample in an opening of an integrating sphere and carrying out photometry. The linear-ray transmittance and the total light transmittance are indicated by the averages at wavelengths of 400 to 800 nm, respectively. As is apparent from FIG. 4, the fiber-reinforced composite material without chemical modification has a haze of 6% at any fiber content. In contrast, the chemically modified fiber-reinforced composite materials each have a haze of 4% regardless of the degree of chemical modification and the fiber content, demonstrating that the transparency is improved.

<Effect of Chemical Modification Indicated by Average Linear-Ray Transmittance>

Figure 5:
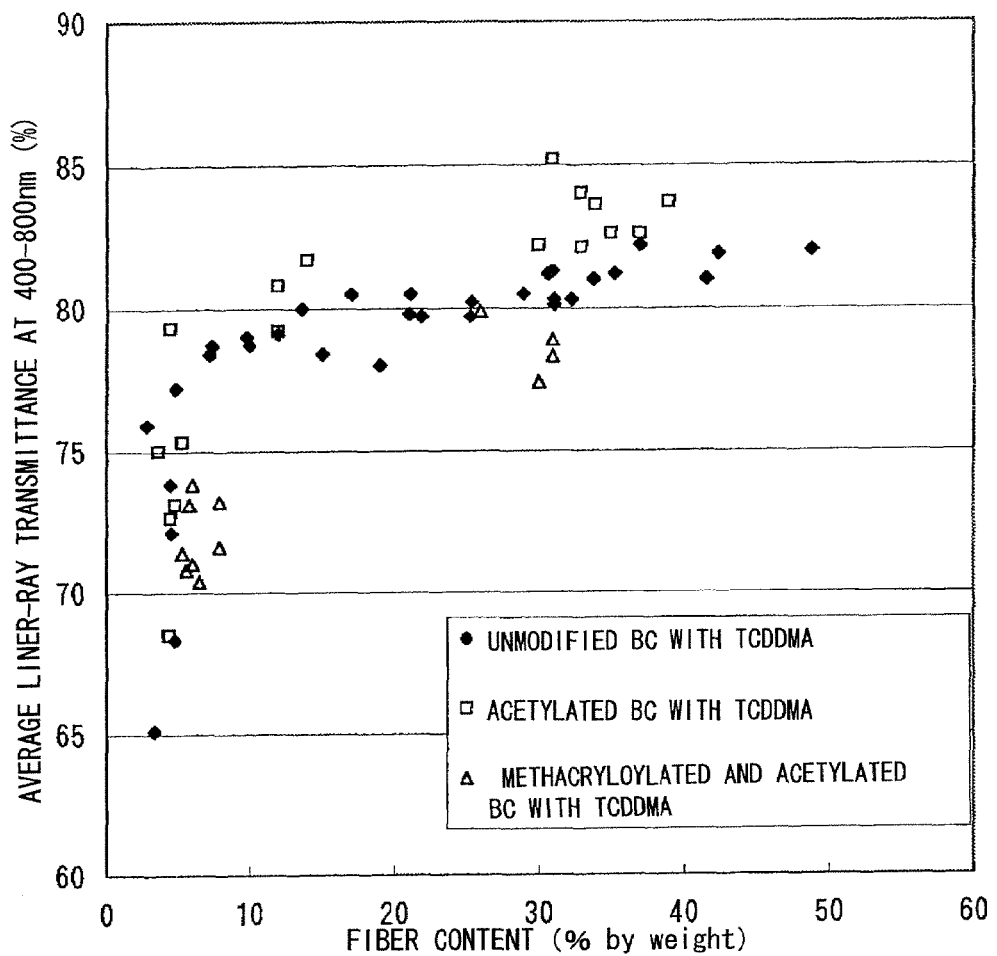
FIG. 5 is a graph showing how the average linear-ray transmittance at wavelengths of 400 to 800 nm of a fiber-reinforced composite material varies depending on the fiber content thereof.

A series of fiber-reinforced composite materials having optional fiber contents was manufactured by the above procedure using bacterial celluloses undergone various chemical modification treatments and bacterial cellulose without chemical modification, and the effects of the chemical modification treatments were determined based on the average linear-ray transmittance. The results are shown in FIG. 5. FIG. 5 demonstrates that the acetylated fiber-reinforced composite materials show an improved average linear-ray transmittance in the entire region at wavelengths of 400 to 800 nm.

<Effect of Chemical Modification on Coefficient of Thermal Expansion>

Figure 6:
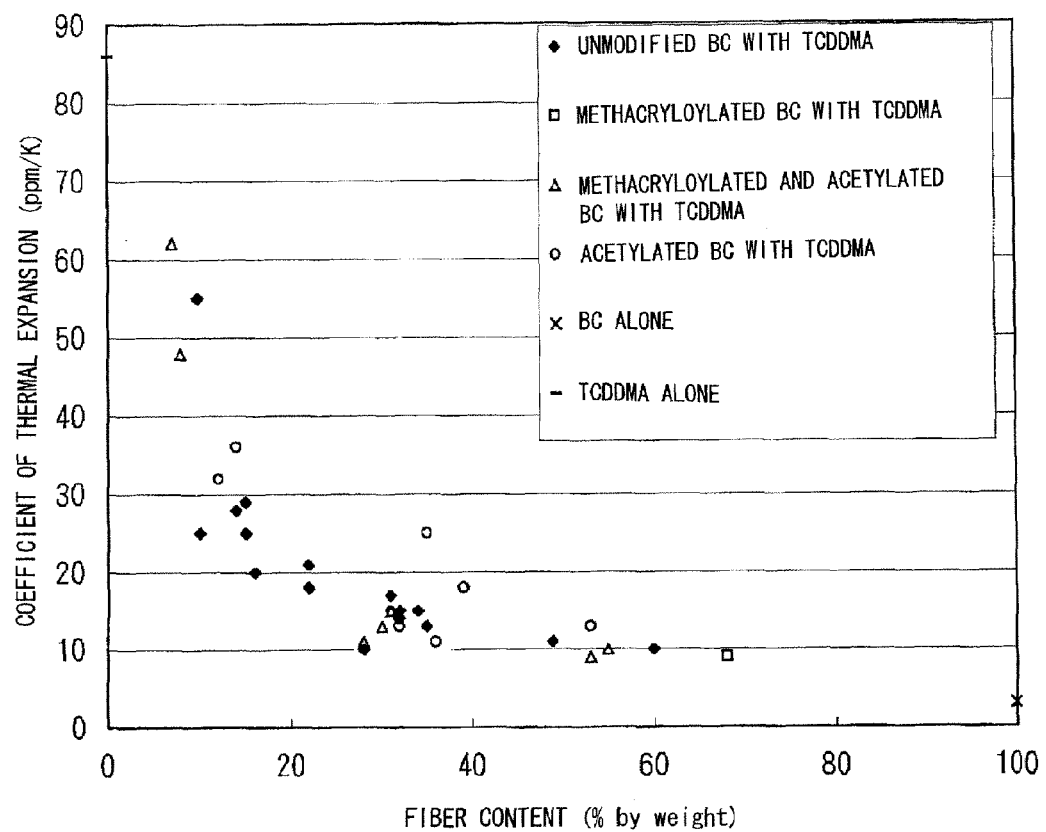
FIG. 6 is a graph showing how the coefficient of thermal expansion of a fiber-reinforced composite material varies depending on the fiber content thereof.

A series of fiber-reinforced composite materials having optional fiber contents was manufactured by the above procedure using bacterial celluloses undergone various chemical modification and bacterial cellulose without chemical modification, and the coefficients of linear thermal expansion of the composite materials were determined. The results are shown in FIG. 6. As is seen from FIG. 6, the chemical modification did not act to increase the coefficient of thermal expansion.

[Use in Light-Emitting Device]

A series of transparent substrates 30 mm long, 30 mm wide, and 0.3 to 0.5 mm thick composed of fiber-reinforced composite materials was prepared by the procedure of Examples 1 to 6. Using these, a series of organic electroluminescent devices was prepared according to the following procedure:

1) The substrate was washed with pure water while spinning and was dried by the application of nitrogen gas.

2) Since having a high surface roughness, this substrate was coated with an ultraviolet-curable resin by spin coating and was irradiated with ultraviolet rays (UV) to cure the resin to thereby yield a smoothing layer having a thickness of about 2 μm thereon.

3) A silicon oxynitride film having a thickness of 100 nm was deposited as a gas-barrier film on the substrate bearing the smoothing surface by sputtering, and subsequently, an indium zinc oxide (IZO) film having a thickness of 100 nm was deposited as an anodic film by sputtering thereon.

4) The anodic film deposited in the step 3) was patterned by photolithography to form stripes 2 mm wide. More specifically, a positive-working resist was applied to the anodic film, was dried, was irradiated with ultraviolet rays through a photomask, and was immersed in a resist developer for one minute to thereby remove the resist in exposed portions. After being washed with water, the article was immersed in an etchant for IZO for 3 minutes to thereby remove the IZO film in exposed portions. After being washed with water and stripping the residual resist, the article was washed with water, was dried, and thereby yielded the patterned electrode.

5) The substrate prepared in the step 4) was treated by the application of ultraviolet rays and ozone, was placed in a vacuum chamber, and films as mentioned below were sequentially deposited and laminated by vapor deposition, and thereby yielded organic electroluminescent devices.

Copper phthalocyanine (35 nm thick)
α-NPD (45 nm thick)
$Alq_3$ (55 nm thick)
$Li_2O$ (1 nm thick)
Al (100 nm thick)

6) Thereafter, a protective film composed of silicon nitride and having a thickness of about 1 μm was deposited by chemical vapor deposition (CVD) so as to cover the entire of the device other than an electrode lead-out.

7) In addition, a hard coating layer composed of an ultraviolet-curable resin and having a thickness of about 2 μm was formed on the protective layer.

A direct-current (DC) voltage of 6 V was applied to the series of light-emitting devices to find that each of the light-emitting devices could emit green light at about 1000 $cd/m^2$.

While the present invention has been shown and described in detail with reference to specific embodiments thereof, it will be understood by those skilled in the art that various changes and modifications may be made without departing from the spirit and scope of the present invention.

The present invention is based on Japanese Patent Application No. 2005-25382 filed on Feb. 1, 2005 and Japanese Patent Application No. 2005-208150 filed on Jul. 19, 2005, the entire contents of which being incorporated herein by reference.

The invention claimed is:

1. A fiber-reinforced composite material comprising a matrix material and an assembly of cellulose fibers impregnated with the matrix material,
    wherein the cellulose fibers are microfibrils of cellulose, which form base skeletons of plant cell walls, or fibers constituting the microfibrils, and
    wherein hydroxy groups of the cellulose fibers are chemically modified through a reaction with one or more chemical modifiers selected from the group consisting of an acid, an alcohol, a halogenating reagent, an acid anhydride, and an isocyanate, so that the ratio of a functional group introduced by the chemical modification is 5 to 40 percent by mole based on the hydroxyl groups of cellulose fibers before the chemical modification.

2. The fiber-reinforced composite material according to claim 1, wherein the functional group is one or more functional groups selected from the group consisting of acetyl group, methacryloyl group, propanoyl group, butanoyl group, iso-butanoyl group, pentanoyl group, hexanoyl group, heptanoyl group, octanoyl group, nonanoyl group, decanoyl group, undecanoyl group, dodecanoyl group, myristoyl group, palmitoyl group, stearoyl group, pivaloyl group, 2-methacryloyloxyethyl isocyanoyl group, methyl group, ethyl group, propyl group, iso-propyl group, butyl group, iso-butyl group, tert-butyl group, pentyl group, hexyl group, heptyl group, octyl group, nonyl group, decyl group, undecyl group, dodecyl group, myristyl group, palmityl group, and stearyl group.

3. The fiber-reinforced composite material according to claim 2, wherein the functional group is acetyl group and/or methacryloyl group.

4. The fiber-reinforced composite material according to claim 1, wherein the ratio of the introduced functional group is 10 to 25 percent by mole based on the hydroxy groups of cellulose fibers.

5. The fiber-reinforced composite material according to claim 1, wherein the assembly of cellulose fibers is an assembly of cellulose fibers having an average fiber diameter of 4 to 200 nm.

6. The fiber-reinforced composite material according to claim 1, wherein the cellulose fibers are bacterial cellulose.

7. The fiber-reinforced composite material according to claim 1, wherein the cellulose fibers are isolated from plant fibers.

8. The fiber-reinforced composite material according to claim 7, wherein the cellulose fibers are prepared by further grinding microfibrillated cellulose fibers.

9. The fiber-reinforced composite material according to claim 1, wherein the fiber-reinforced composite material has a fiber content of 10 percent by weight or more.

10. The fiber-reinforced composite material according to claim 1, wherein the matrix material is a synthetic polymer.

11. The fiber-reinforced composite material according to claim 1, wherein the fiber-reinforced composite material has a moisture regain of 3% or less, and wherein the moisture regain is measured according to the following method of measuring moisture regain:
    A sample is left stand at 50° C. in a dry atmosphere for 24 hours, followed by weighing (dry weight $W_o$);
    next, the sample is left stand in an atmosphere at a temperature of 20° C. and humidity of 60% until the weight becomes constant, followed by weighing (humid weight $W_1$); and
    the moisture regain is determined by calculation based on the dry weight $W_0$ and the humid weight $W_1$ according to the following equation:

Moisture regain (%)=$(W_1-W_0)/W_0 \times 100$.

12. A method for manufacturing the fiber-reinforced composite material of claim 1, the method comprising:
    bringing an assembly of cellulose fibers into contact with a reaction liquid comprising the chemical modifier to cause chemical modification as a result of a reaction between hydroxyl groups of the cellulose fibers and the chemical modifier to thereby yield an assembly of modified cellulose fibers;
    impregnating the assembly of modified cellulose fibers with an impregnating liquid capable of forming the matrix material; and curing the impregnating liquid.

13. The method of manufacturing a fiber-reinforced composite material, according to claim 12, the method comprising:
    impregnating the assembly of cellulose fibers with water to yield an assembly of hydrated cellulose fibers;
    replacing water in the assembly of hydrated cellulose fibers with a first organic solvent; and
    replacing the first organic solvent in the assembly of cellulose fibers with the reaction liquid and maintaining the reaction liquid therein.

14. The method of manufacturing a fiber-reinforced composite material, according to claim 13, further comprising:
    replacing the reaction liquid in the assembly of cellulose fibers with a second organic solvent; and
    replacing the second organic solvent in the assembly of cellulose fibers with an impregnating liquid capable of forming the matrix material and curing the impregnating liquid.

15. A fiber-reinforced composite material comprising a matrix material and an assembly of cellulose fibers impregnated with the matrix material, wherein the fiber-reinforced composite material has a moisture regain of 3% or less, and wherein the moisture regain is measured according to the method as specified in claim 11.

16. An organic electroluminescent device using a transparent substrate comprising the fiber-reinforced composite material of claim 1.

17. A photoreceptor device using a transparent substrate comprising the fiber-reinforced composite material of claim 1.

18. A fiber-reinforced composite material comprising a matrix material and an assembly of cellulose fibers impregnated with the matrix material, wherein the fiber-reinforced composite material has a moisture regain of 3% or less, and wherein the moisture regain is measured to the following method of measuring moisture regain:
    A sample is left stand at 50° C. in a dry atmosphere for 24 hours, followed by weighing (dry weight $W_0$);
    next, the sample is left stand in an atmosphere at a temperature of 20° C. and humidity of 60% until the weight becomes constant, followed by weighing (humid weight $W_1$); and
    the moisture regain is determined by calculation based on the dry weight $W_0$ and the humid weight $W_1$ according to the following equation:

Moisture regain (%)=$(W_1-W_0)/W_0 \times 100$.

19. An organic electroluminescent device using a transparent substrate comprising a fiber-reinforced composite material comprising a matrix material and an assembly of cellulose fibers impregnated with the matrix material, wherein hydroxy groups of the cellulose fibers are chemically modified through a reaction with one or more chemical modifiers selected from the group consisting of an acid, an alcohol, a halogenating reagent, an acid anhydride, and an isocyanate, so that the ratio of a functional group introduced by the chemical modification is 5 to 40 percent by mole based on the hydroxyl groups of cellulose fibers before the chemical modification.

20. A photoreceptor device using a transparent substrate comprising a fiber-reinforced composite material comprising a matrix material and an assembly of cellulose fibers impregnated with the matrix material, wherein hydroxy groups of the cellulose fibers are chemically modified through a reaction with one or more chemical modifiers selected from the group consisting of an acid, an alcohol, a halogenating reagent, an acid anhydride, and an isocyanate, so that the ratio of a functional group introduced by the chemical modification is 5 to 40 percent by mole based on the hydroxyl groups of cellulose fibers before the chemical modification.

* * * * *